US012672377B2

(12) United States Patent
Yang et al.

(10) Patent No.: US 12,672,377 B2
(45) Date of Patent: Jun. 30, 2026

(54) DEEP TRENCH ISOLATION STRUCTURE AND METHODS FOR FABRICATION THEREOF

(71) Applicant: TAIWAN SEMICONDUCTOR MANUFACTURING COMPANY, LTD., Hsinchu (TW)

(72) Inventors: Kai-Yun Yang, Tainan (TW); Yu-Jen Wang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1039 days.

(21) Appl. No.: 17/850,477

(22) Filed: Jun. 27, 2022

(65) Prior Publication Data

US 2023/0420473 A1      Dec. 28, 2023

(51) Int. Cl.
*H10F 39/00*          (2025.01)

(52) U.S. Cl.
CPC ......... *H10F 39/807* (2025.01); *H10F 39/024* (2025.01)

(58) Field of Classification Search
CPC .... H10F 39/807; H10F 39/024; H10F 39/014; H10F 39/199; H10F 39/8053; H10F 39/8063; H10F 39/811
See application file for complete search history.

(56) References Cited

U.S. PATENT DOCUMENTS

| | | | |
|---|---|---|---|
| 2019/0139997 A1* | 5/2019 | Chiang | H10F 39/807 |
| 2020/0066768 A1* | 2/2020 | Cheng | H10F 39/8053 |
| 2021/0202546 A1* | 7/2021 | Liu | H10F 39/8023 |
| 2022/0285409 A1* | 9/2022 | Yang | H10F 39/016 |

* cited by examiner

*Primary Examiner* — Eliseo Ramos Feliciano
*Assistant Examiner* — Sophia W Kao
(74) *Attorney, Agent, or Firm* — NZ Carr Law Office

(57) ABSTRACT

A Deep Trench Isolation (DTI) structure is disclosed. A DTI structure formed in a semiconductor substrate. The DIT structure includes an isolation layer and filling material. The isolation layer is formed from a p-type semiconductor material. Sidewall portions of the isolation layer are in contact with the semiconductor substrate. A bottom portion of the isolation layer is in contact with a connection feature, which is connected to an interconnect structure and configured to apply a bias to the isolation layer of the DTI structure to achieve a controllable passivation in the semiconductor substrate.

20 Claims, 26 Drawing Sheets

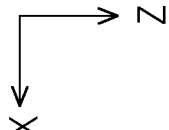
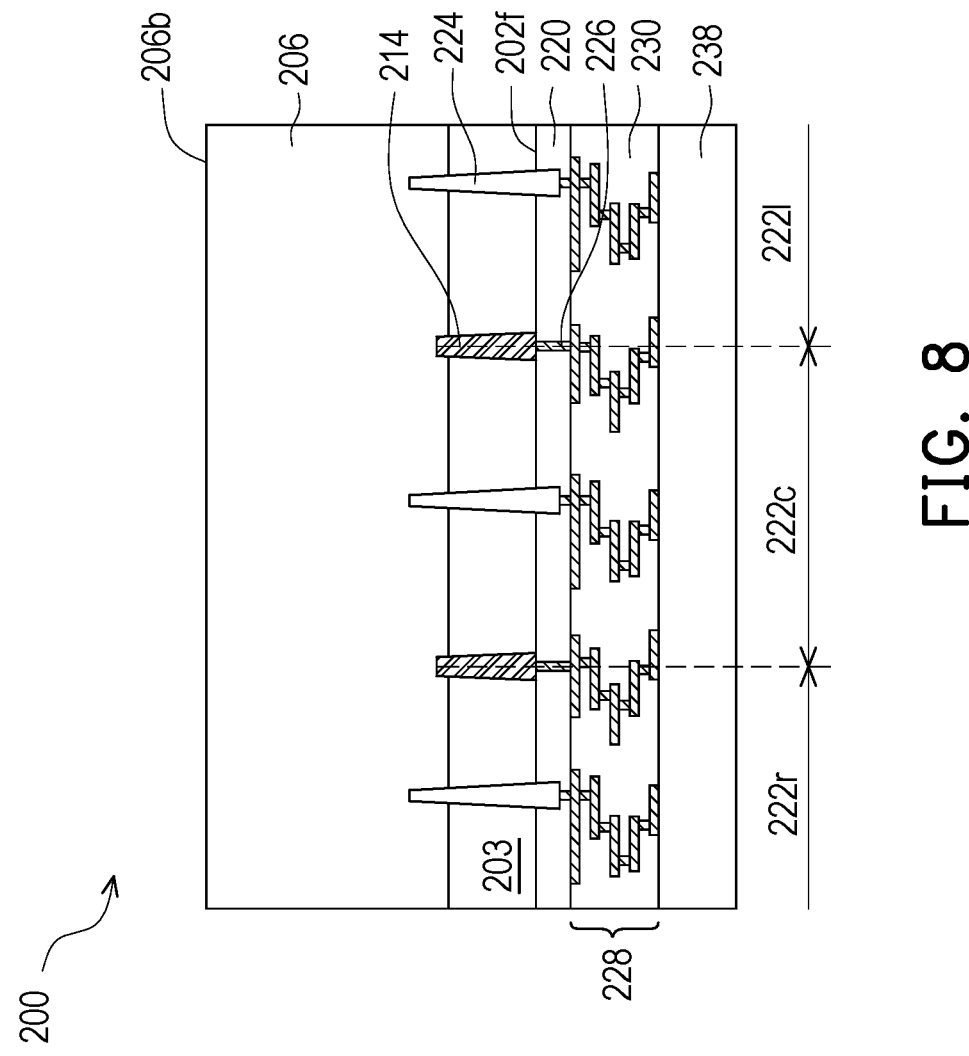
FIG. 8

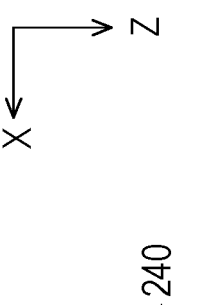
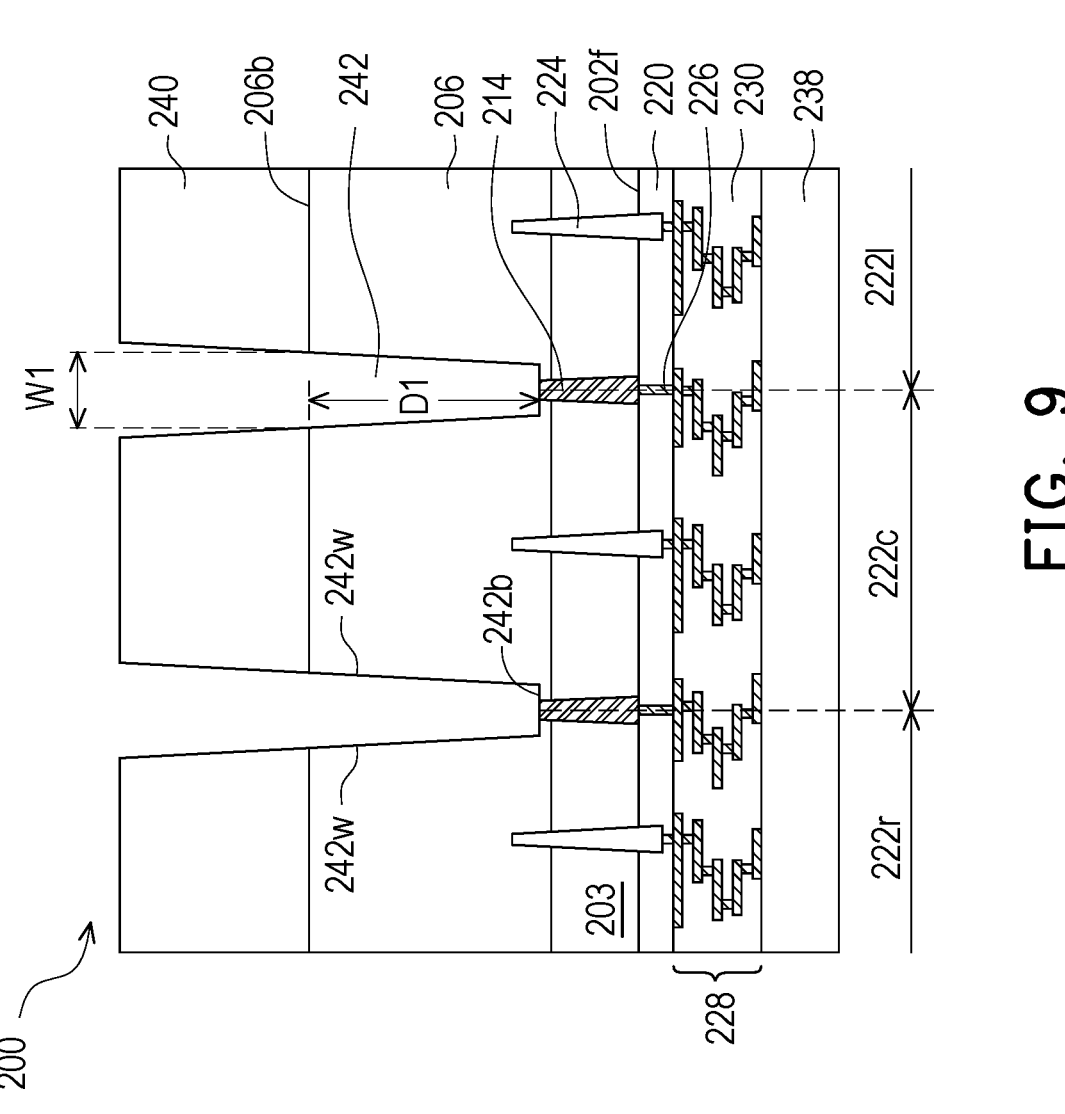
FIG. 9

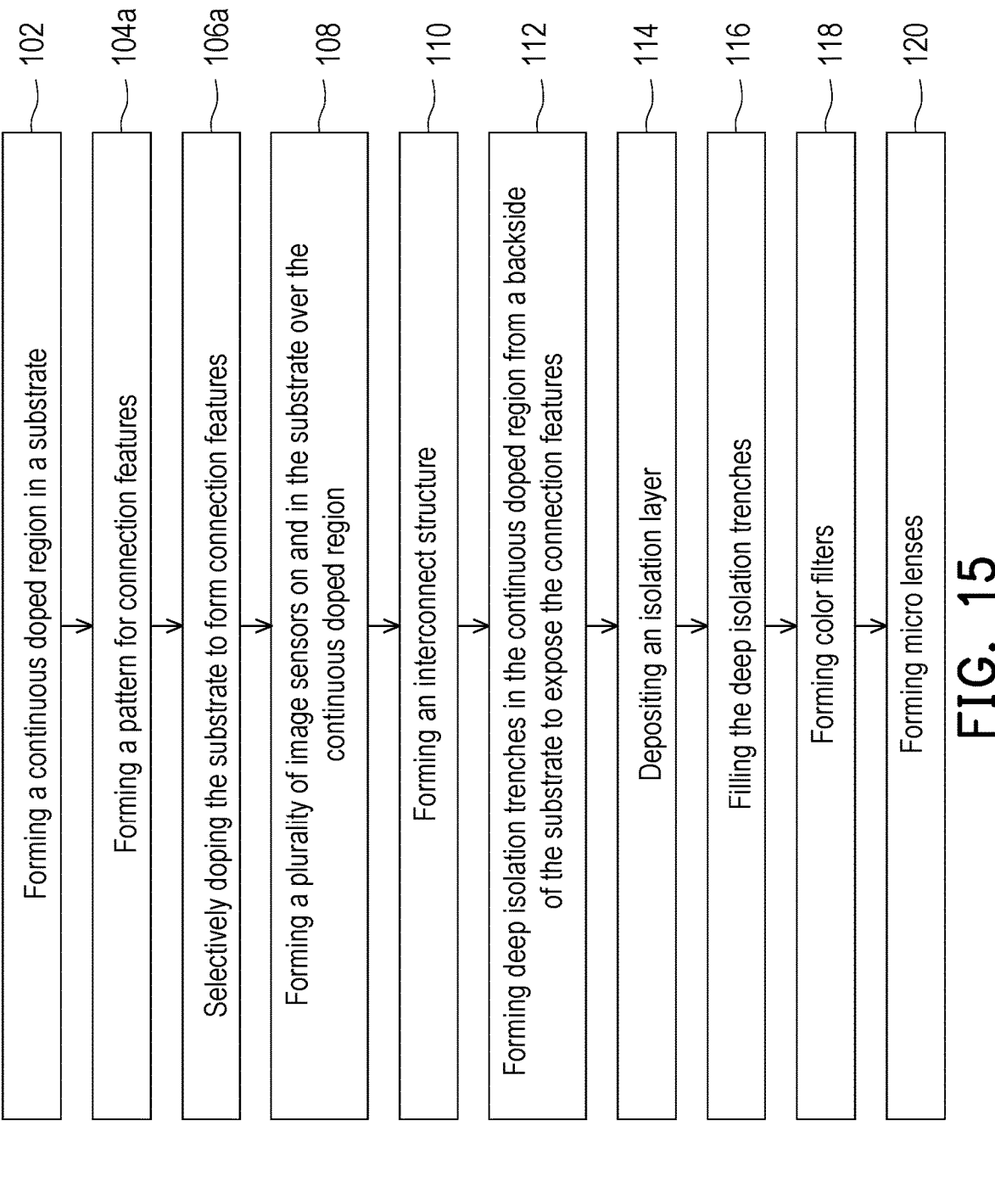

102 — Forming a continuous doped region in a substrate

104a — Forming a pattern for connection features

106a — Selectively doping the substrate to form connection features

108 — Forming a plurality of image sensors on and in the substrate over the continuous doped region 110 — Forming an interconnect structure 112 — Forming deep isolation trenches in the continuous doped region from a backside of the substrate to expose the connection features 114 — Depositing an isolation layer 116 — Filling the deep isolation trenches 118 — Forming color filters 120 — Forming micro lenses 100a

FIG. 15

DEEP TRENCH ISOLATION STRUCTURE AND METHODS FOR FABRICATION THEREOF

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, developments in IC processing and manufacturing are researched.

Various isolation structures are formed in ICs to provide isolation between adjacent semiconductor devices and device groups formed in adjacent wells. Deep trench isolation (DTI) structures are used to provide electrical and/or optical isolations between high voltage devices and image sensors. As the device dimension decreases, it is challenging to prevent leakage through current DTI structure design.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

FIGS. 2-5, 5A, 5B, 5C, 6-11, 11A, 11B, 12, 12A, 12B, 12C, 12D and 12E schematically illustrate a semiconductor device at various stages of fabrication according to the method of FIG. 1.

FIG. 15 is a flow chart of a method for fabricating a semiconductor device including DTI structures according to embodiments of the present disclosure.

DETAILED DESCRIPTION

Figure 1:
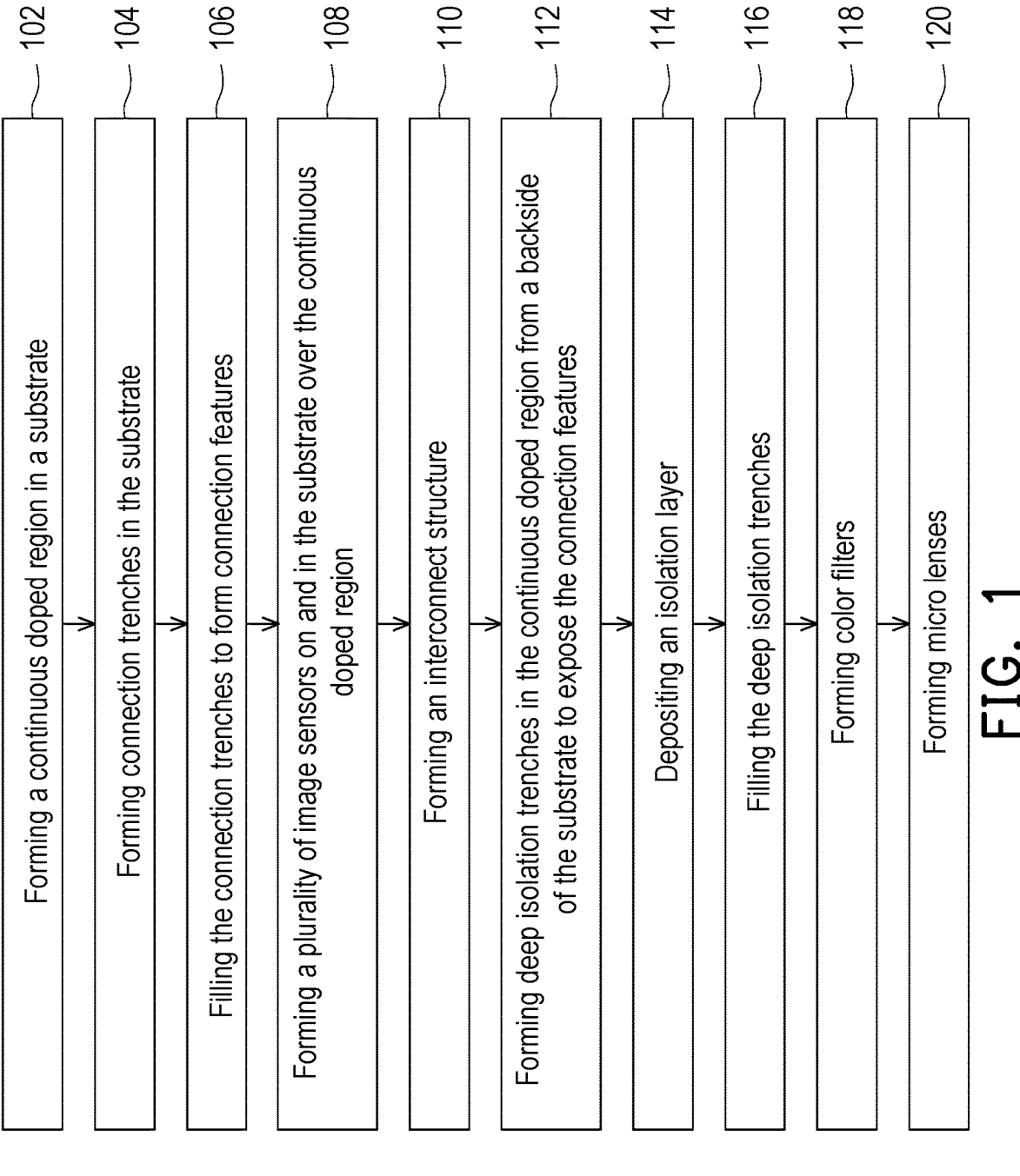
FIG. 1 is a flow chart of a method for fabricating a semiconductor device including DTI structures according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Deep Trench Isolation (DTI) structure in a semiconductor substrate and the method of forming the same are provided according to various embodiments. The intermediate stages of forming the DTI structure are illustrated according to some embodiments. Some variations of some embodiments are discussed.

DTI structures according to embodiments of the present disclosure includes an isolation layer and filling material. The isolation layer is formed from a p-type semiconductor material. Sidewall portions of the isolation layer are in contact with a semiconductor substrate. A bottom portion of the isolation layer is in contact with a connection feature, which is connected to an interconnect structure and configured to apply a bias to the isolation layer of the DTI structure to achieve a controllable passivation in the semiconductor substrate. The isolation layer and the semiconductor substrate form a junction, such as p+/n junction or p+/p high-low junction or p+/intrinsic high-low junction. The intrinsic built-in fields within the junction could provide physical passivation. In some embodiments, the isolation layer may include p+ type silicon (Si) or silicon carbide (SiC) or silicon germanium (SiGe), or any suitable material to form such a junction. External voltages may be applied to the isolation layer via the connection feature. The external voltage acts as a reverse voltage to a p-n junction to generate hole accumulation. Applying the external voltage enables a controllable reverse bias to enhance electric field as well as passivation of the deep trench isolation structure.

The DTI structure may be used for Backside Illumination (BSI) Complementary Metal-Oxide-Semiconductor (CMOS) image sensors or Front Side Illumination (FSI) CMOS image sensors, logic devices, and any suitable devices in which deep trench isolation are used.

FIG. 1 is a flow chart of a method 100 for fabricating a semiconductor device including DTIs according to embodiments of the present disclosure. FIGS. 2-5, 5A, 5B, 5C, 6-11, 11A, 11B, 12, 12A, 12B, 12C, 12D, and 12E schematically illustrate a semiconductor device 200 at various stages of fabrication according to the method 100. In some embodiments, the semiconductor device 200 fabricated according to the method 100 includes BSI image sensors. It is understood that additional steps can be provided before, during, and/or after the method 100, and some of the steps described can be replaced, eliminated, and/or moved around for additional embodiments of the method 100.

Figure 2:
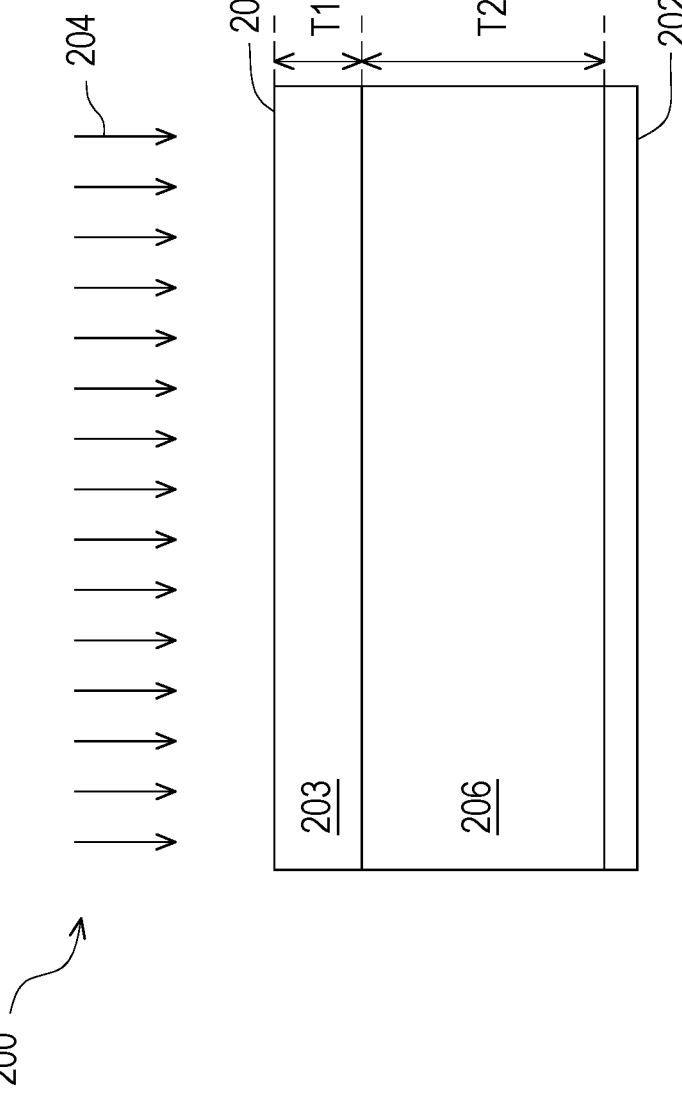

At operation 102 of the method 100, an implantation process is performed to form a continuous doped region 206 in a semiconductor substrate 202, as shown in FIG. 2. FIG. 2 is a schematic cross-sectional view of the semiconductor device 200.

According to some embodiments of the present disclosure, semiconductor substrate 202 is a crystalline silicon substrate. According to other embodiments of the present disclosure, the semiconductor substrate 202 includes an elementary semiconductor such as germanium; a compound semiconductor including silicon carbon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates such as multi-layered or gradient substrates may also be used. The semiconductor substrate 202 has a front surface 202$f$ and a back surface 202$b$. In some embodiments, the front surface 202$f$ and the back surface 202$b$ may be on (100) or (001) surface planes.

The continuous doped region 206 may be formed by an implantation process to implant dopants 204 from the front surface 202$f$ of the semiconductor substrate 202. As shown in FIG. 2, the implantation may be a blanket process without using any mask and the continuous doped region 206 extends across the entire semiconductor substrate 202. Alternatively, a patterned photoresist mask may be used to expose only regions of the semiconductor substrate 202 wherein a plurality of devices, such as a plurality of image sensors, are to be formed. In some embodiments, the continuous doped region 206 is located within the semiconductor substrate 202 at a distance T1 from the front surface 202$f$. The portion of the semiconductor substrate 202 above the continuous doped region 206 may be referred as a transistor region 203 because various transistors may be formed therefrom. The continuous doped region 206 may have a thickness T2. The distance T1 and thickness T2 may be selected according to circuit design and achieved by adjusting bias applied to the semiconductor substrate 202 and flow density of the dopants 204 during implantation process.

In some embodiments, the continuous doped region 206 is intended as light sensing regions for a plurality of image sensors. In some embodiments, the continuous doped region 206 may be doped by a n-type dopants and intent to be N-wells for a plurality of deep N-type pinned photodiodes (DNPPD) in the plurality of image sensors to be formed. The dopants 204 may include one or more n-type dopants, such as phosphorous, arsenic, antimony, or the like. In some embodiments, the continuous doped region 206 may include n-type dopants at a concentration in a range between about 1E15 atom/cm$^3$ and about 1E20 atom/cm$^3$.

In the state-of-art process, light sensing regions for a plurality of image sensors are formed as individual doped regions by a masked ion implantation process so that p-type dopants may be implanted between the individually doped light sensing regions and DTI structures with high-k isolation layer may be formed in the p-doped regions. As discussed later, the DTI structure of the present disclosure may be used to directly isolate the light sensing regions without p-doped regions. As a result, one round of photolithographic processes may be omitted, and cost of manufacturing reduced.

Figure 3:
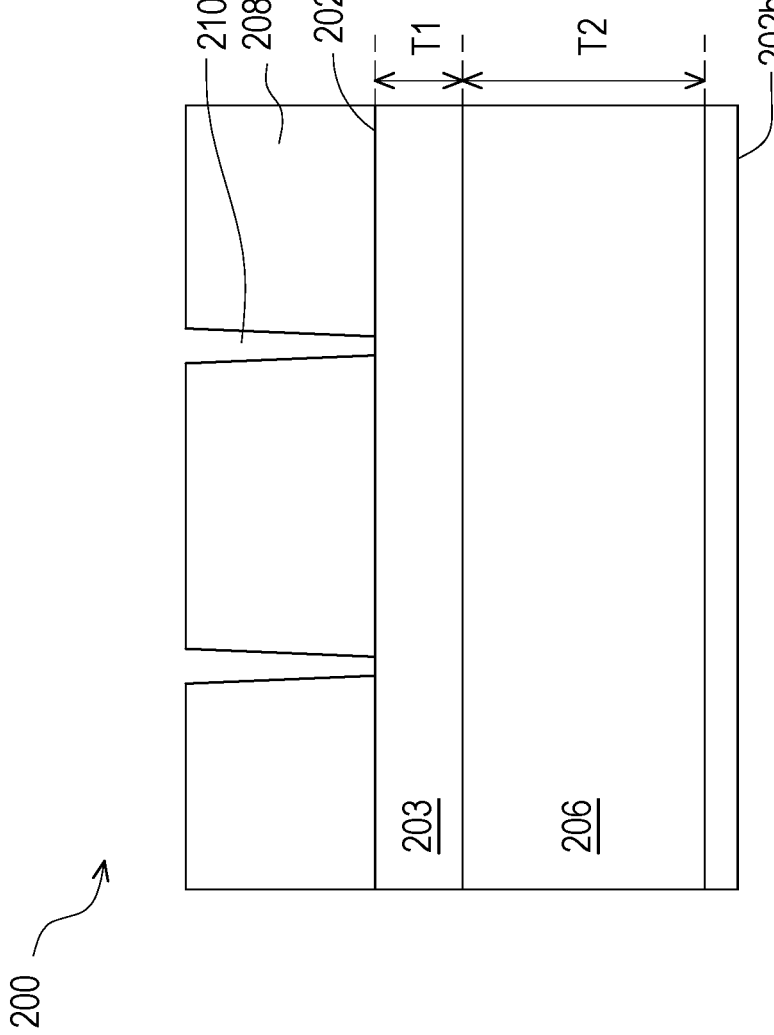
Figure 4:
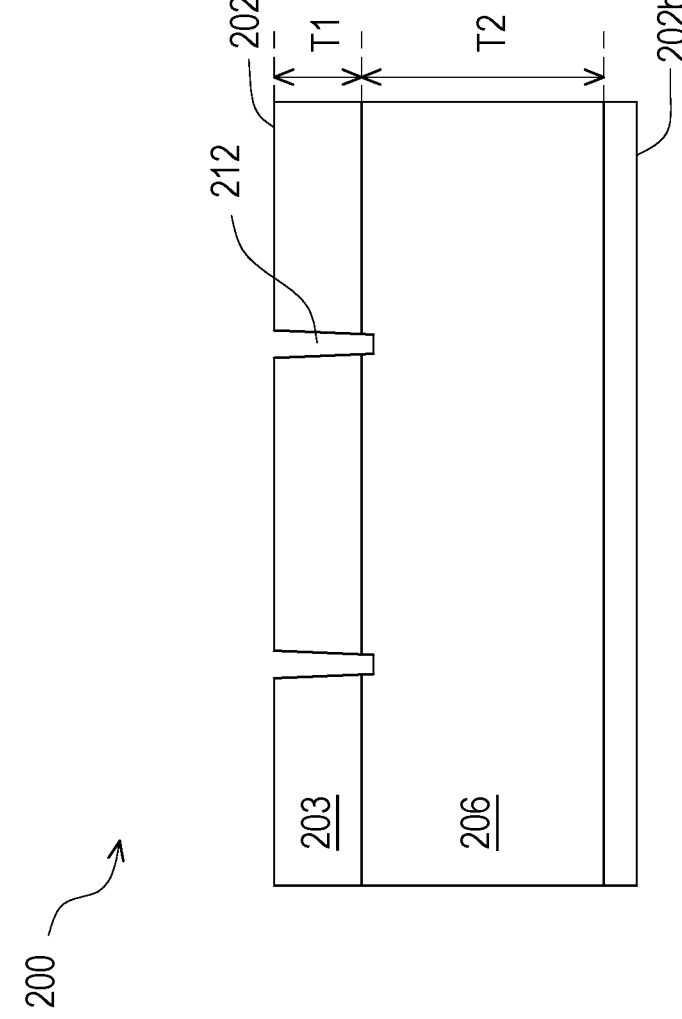

At operation 104, connection trenches 212 are formed in the semiconductor substrate 202, as shown in FIGS. 3-4. In FIG. 3, a masking layer 208 may be deposited on the front surface 202$f$ of the semiconductor substrate 202. A patterning process, such as a photolithography process, is performed form a plurality of openings 210 through the masking layer 208 and expose the front surface 202$f$ of the semiconductor substrate 202. In some embodiments, the masking layer 208 may comprise photoresist or a nitride, for example silicon nitride (SiN), patterned using a photolithography process.

In FIG. 4, an etch process is performed to remove a portion of the semiconductor substrate 202 and form the connection trenches 212 in the semiconductor substrate 202. In some embodiments, the etch process may be a dry etch process using an etching chemistry comprising a fluorine species, such as carbon tetrafluoride (CF$_4$), trifluoromethane (CHF$_3$), octafluorocyclobutane (C$_4$F$_8$), etc. In other embodiments, the etch process may be a wet etching process using a wet etchant such as hydrofluoric acid (HF), or Tetramethylammonium hydroxide (TMAH). In some embodiments, the connection trenches 212 may penetrate the transistor region 203 and extend into the continuous doped region 206. The masking layer 208 can then be removed.

Figure 5:
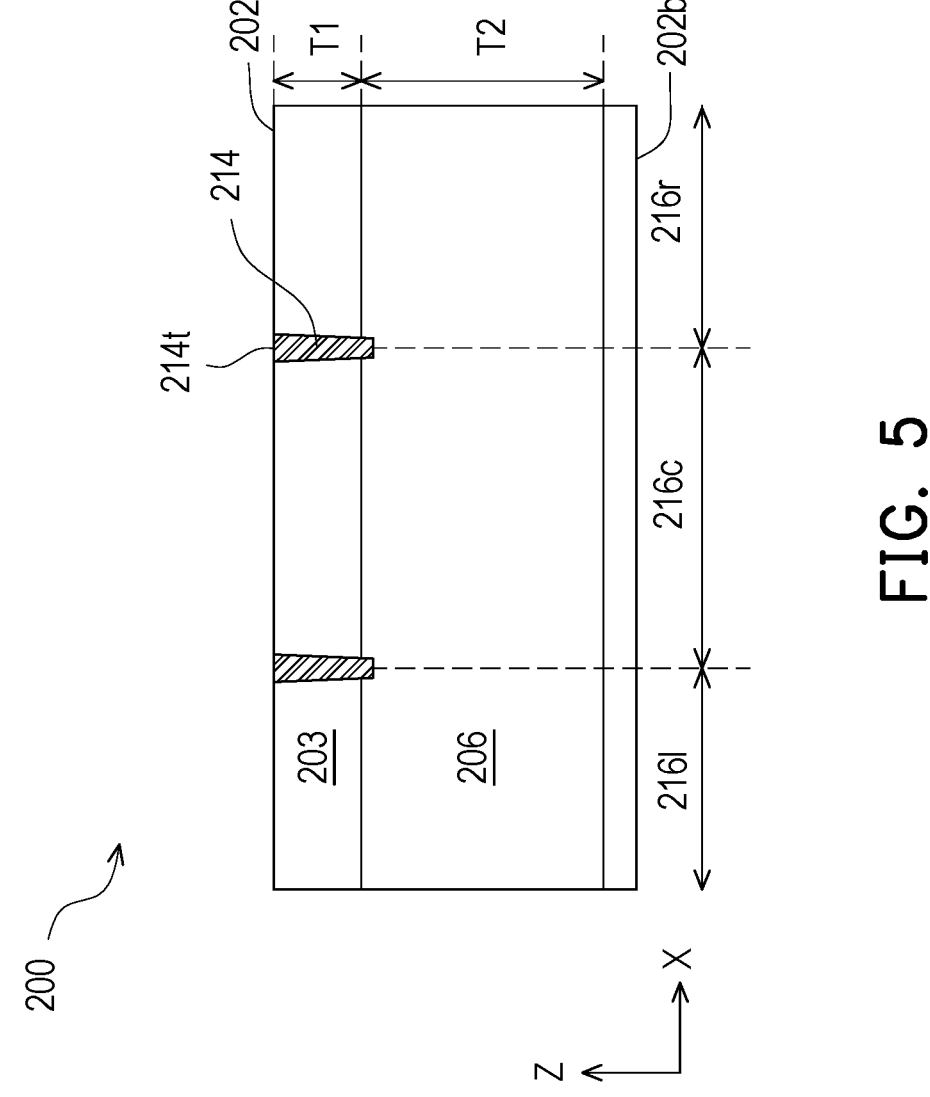

At operation 106, connection features 214 are formed to in the semiconductor substrate 202, as shown in FIG. 5. The connection features 214 are formed by filling the connection trench 212 with one or more conductive materials.

In some embodiments, the connection features 214 may include a doped semiconductor material. In some embodiments, the connection features 214 are formed by p-doped semiconductor material with a dopant concentration greater than 1E14/cm$^3$. Suitable dopants may include boron (B), aluminum (Al), and gallium (Ga). For example, the connection features 214 may include a p-type semiconductor material, such as silicon (Si), silicon carbide (SiC), or silicon geranium (SiGe) with a dopant concentration in a range between about 1E14/cm$^3$ and about 1E17/cm$^3$. A dopant concentration lower than 1E14/cm$^3$ may not provide enough free radicals to enable controllable passivation in the DTI structures to be connected. A dopant concentration higher than 1E17/cm$^3$ may increase manufacture cost without additional benefits for controllable passivation in the DTI structures to be connected.

In some embodiments, the doped conductive material for the connection features 214 may be deposited in the connection openings 210 by epitaxial growth. In other embodiments, the connection features 214 may be formed by low pressure chemical vapor deposition (PECVD). After deposition of the doped semiconductor material, a planarization process, such as a chemical mechanical polishing (CMP) may be performed such that a top surface 214$t$ is substantially planar with the front surface 202$f$ of the semiconductor substrate 202.

As discussed below, the connection features 214 are to contact subsequently formed DTI structures, which isolate individual devices, such as individual image sensors. In some embodiments, the connection features 214 are formed in boundaries between individual devices to align with subsequently formed DTI structures. Therefore, the connection features 214 may form a connection grid corresponding to an array of individual devices to be formed.

Figure 5A:
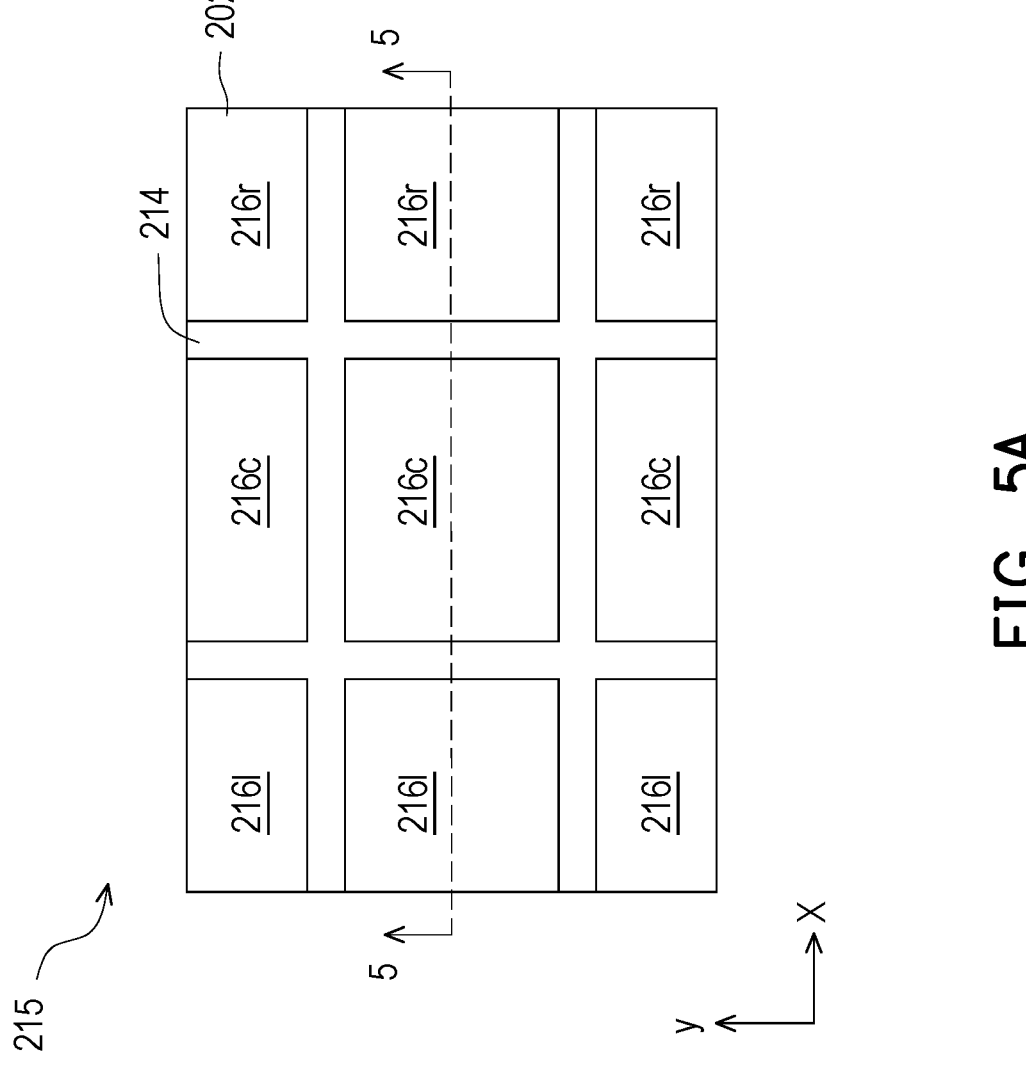

FIG. 5A is a schematic top view of the semiconductor device 200 showing a connection grid 215 of the connection features 214 according to one embodiments of the present disclosures. As shown in FIG. 5A, each area 2161, 216$c$, 216$r$ (collectively 216) schematically represents a light sensing region of an individual imaging sensor to be formed. The connection features 214 are formed in boundary areas between neighboring areas 216. Even though the areas are shown rectangular in FIG. 5A. The areas 216 may be any suitable shapes, such as squares, hexagons, circles, according to the circuit design. In FIG. 5A, the connection features 214 include a plurality of horizontal trench features along the x-direction interact with a plurality of vertical trench features along the y-direction, thus, forming continuous boundaries around the areas 216.

Figure 5B:
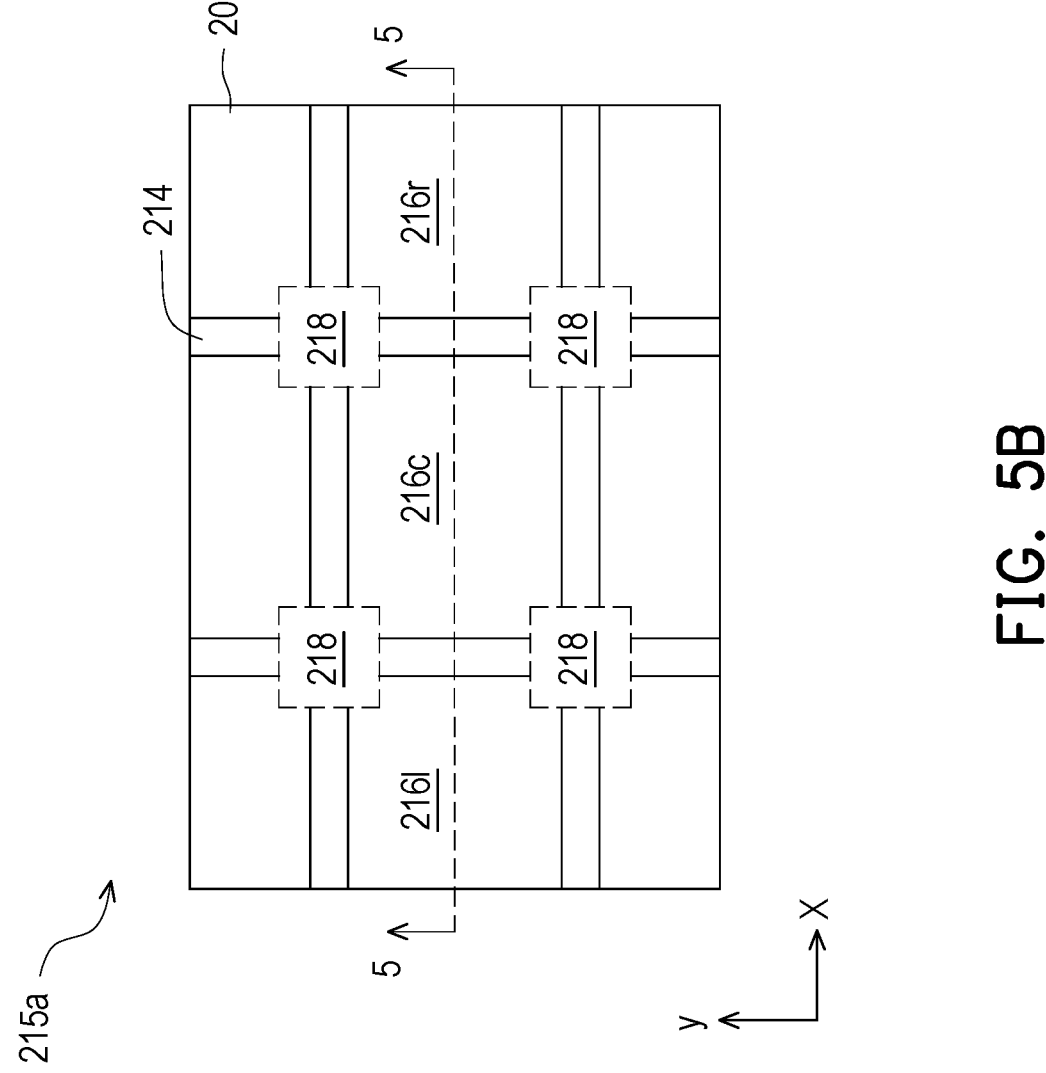

In other embodiments, the connection features 214 may be discrete segments disposed along the boundaries between the areas 216. FIG. 5B is a top view of the semiconductor device 200 showing a connection grid 215$a$ of the connection features 214 according to another embodiment of the present disclosure. In FIG. 5B, the connection features 214 are arranged in a manner similar to the arrangement in FIG. 5A except that the connection features 214 are not present in areas 218. In some circuit design, a device, such as a BIS image sensors, may cover different areas than the sensing areas 216 in the back side. For example, some of transistors may be formed in the areas 218, which overlap with boundaries of the back side sensing areas 216. As a result, the connection features 214 may include a plurality of discrete trench segments.

Figure 5C:
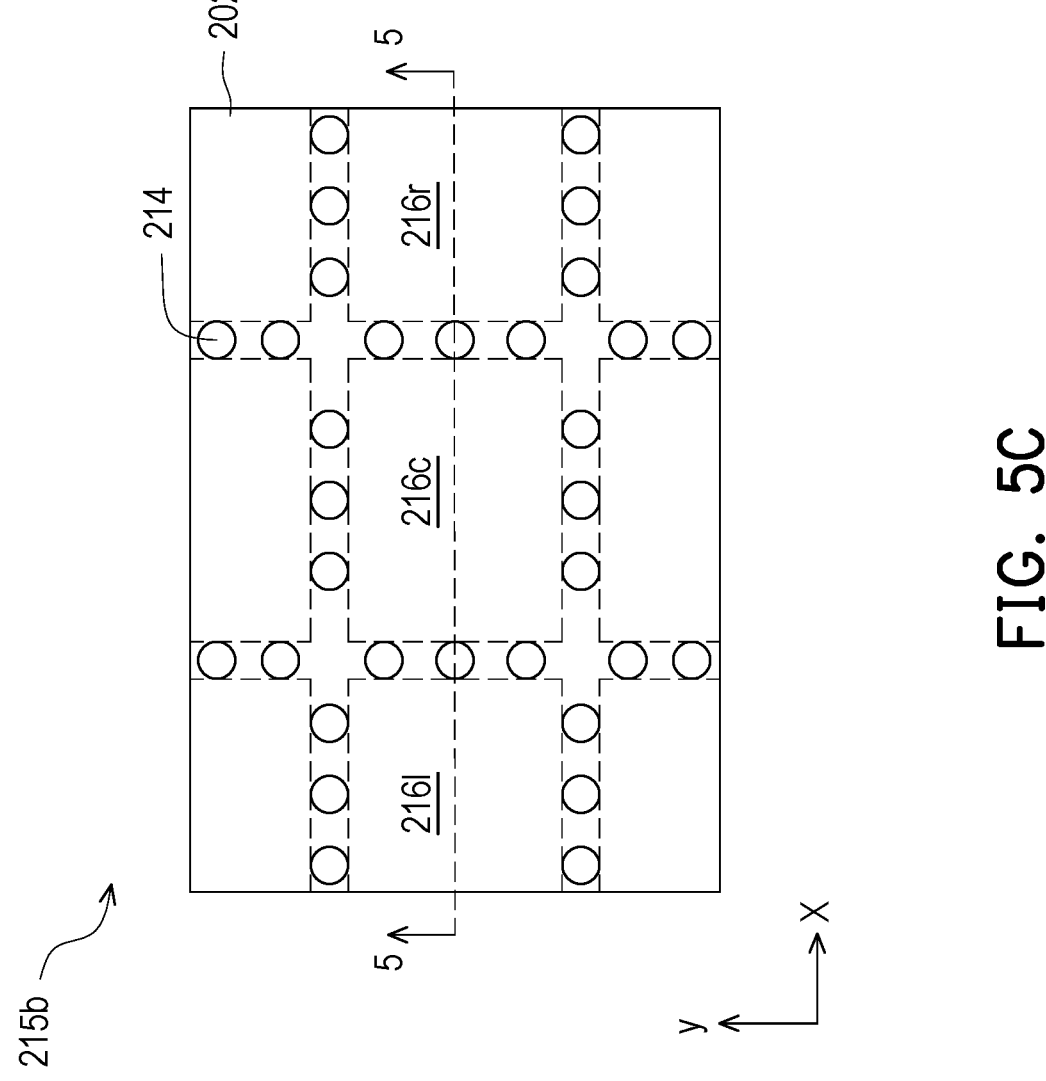

FIG. 5C is a top view of the semiconductor device 200 showing a connection grid 215b of the connection features 214 according to another embodiment of the present disclosure. In FIG. 5C, the connection features 214 are a plurality of vias formed in boundary areas between neighboring areas 216.

Figure 6:
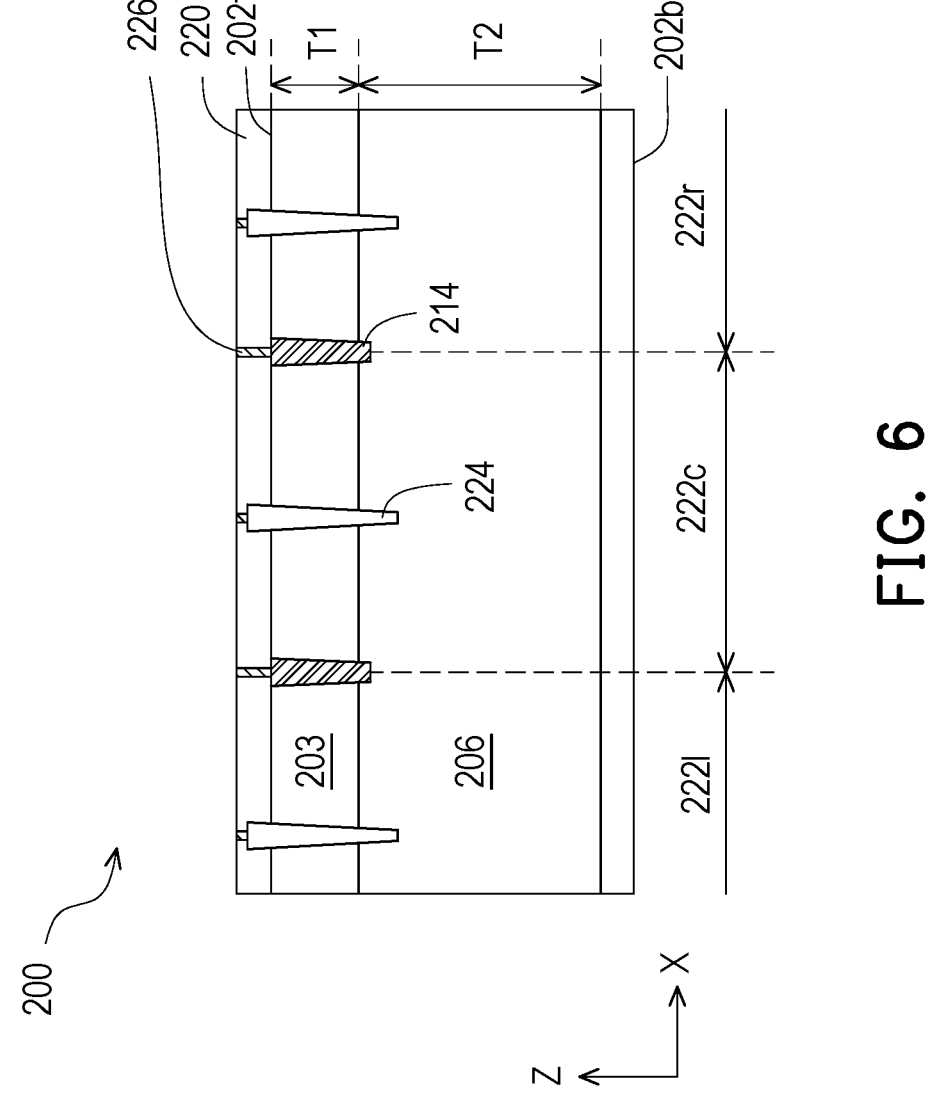

At operation 110, a plurality of device elements 2221, 222c, 222r (collectively 222) are formed in and on the transistor region 203 of the semiconductor substrate 202, as shown in FIG. 6. The plurality of device elements 222 may be any other devices, such as an image sensing device, a logic device, an input/output (I/O) device, a memory device. Each device element 222 may include one or more transistors, such as metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc., diodes, and/or other applicable elements. In some embodiments, the device elements are formed in and on the semiconductor substrate 202 in a front-end-of-line (FEOL) process.

In some embodiments, the plurality of device elements 222 may be formed in the transistor region 203 of the semiconductor substrate 202 and an interlayer dielectric (ILD) layer 220. A connection contact 226 may be formed through the ILD layer 220 to provide electrical connection to the connection features 214.

In some embodiments, the plurality of device elements 222 are a plurality of pixel device for an image sensor. Each pixel device may include a transfer gate 224 which extends into the doped region 206. Various transistors for pixel device may be formed in the semiconductor substrate 202 and the ILD layer 220. For example, a pixel device may include a transfer transistor, a reset transistor, a source-follower transistor, and a select transistor. The pixel device may include other suitable transistors, such as a shutter gate transistor, a storage transfer transistor, or a combination thereof. Source/drain features for various transistors and shallow trench isolation (STI) may be formed in the transistor region 203 of the semiconductor substrate 202. Gate structures for the various transistors may be formed in the ILD layer 220.

Figure 7:
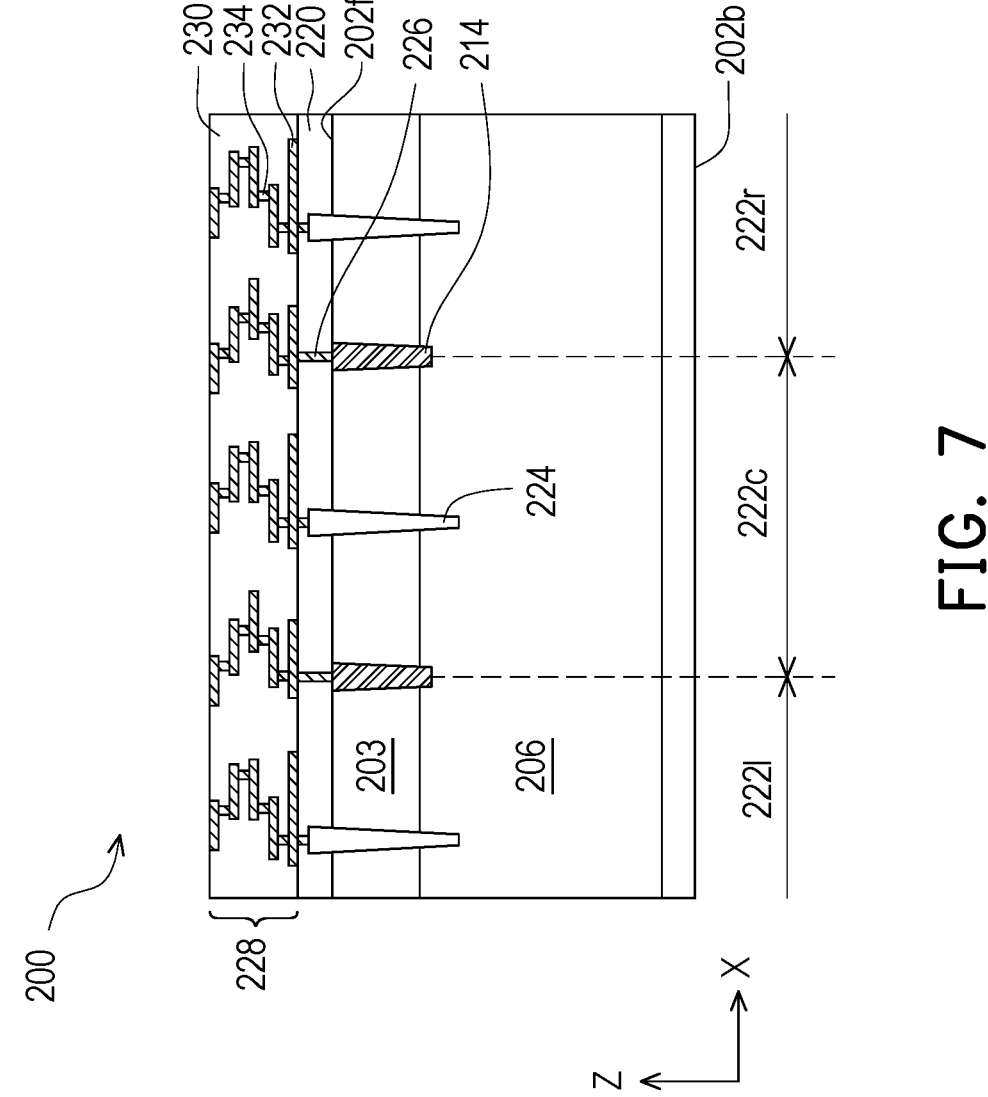

In operation 110, an interconnect structure 228 are formed over the ILD layer 220, as shown in FIG. 7. The interconnection structure 228 includes conductive lines 232 and conductive vias 234 embedded an intermetal dielectric (IMD) layer 230. The interconnect structure 228 includes multiple levels of the conductive lines 232 and the conductive vias 234 to provide electrical paths to various pixel elements 220 and the connection features 214 formed below.

The IMD layer 230 includes one or more dielectric materials to provide isolation functions to various conductive lines 232 and conductive vias 234. The IMD layer 230 may be made from a dielectric material, such as $SiO_x$, $SiO_xC_yH_z$, SiOCN, SiON, or $SiO_xC_y$, where x, y and z are integers or non-integers. In some embodiments, the IMD layer 230 includes a low-k dielectric material having a k-value less than that of silicon dioxide. In some embodiments, the IMD layer 230 may include etch stop layers between levels of low-k dielectric material layers to facilitate patterning and formation of the conductive lines 232 and conductive vias 234 at different levels. The etch stop layers may be made of silicon carbide (SiC), silicon nitride (SixNy), silicon carbonitride (SiCN), silicon oxycarbide (SiOC), silicon oxycarbon nitride (SiOCN), tetraethoxysilane (TEOS) or another applicable material.

The conductive lines 232 and conductive vias 234 may be made from one or more electrically conductive materials, such as metal, metal alloy, metal nitride, or silicide. For example, the conductive lines 232 and conductive vias 234 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, iridium, other suitable conductive material, or a combination thereof.

At operation 112, deep isolation trenches 242 are formed in the doped region 206 of the semiconductor substrate 202, as shown in FIGS. 8 and 9. In FIG. 8, a carrier wafer 238 is attached to the interconnection structure 228 and the semiconductor substrate 202 is flipped over upside down for back side processing.

A backside grinding is performed to grind back surface 202b to thin down the semiconductor substrate 202. In some embodiments, the thickness of the semiconductor substrate 202 may be reduced to smaller than about 10 μm, or smaller than about 5 μm. In some embodiments, the semiconductor substrate 202 is grinded to expose the doped region 206, resulting a back surface 206b, as shown in FIG. 8.

A masking layer 240 may be deposited on the back surface 206b. A patterning process, such as a photolithography process, is performed form a plurality of openings through the masking layer 240 and expose the back surface 206b of the semiconductor substrate 202. In some embodiments, the masking layer 240 may comprise photoresist or a nitride, such as SiN, patterned using a photolithography process.

An etch process is performed to remove a portion of the doped region 206 in the semiconductor substrate 202 and form the deep isolation trenches 242. In some embodiments, an anisotropic etching process is performed so that sidewalls 242w of trenches 242 are straight and vertical, i.e., the sidewalls 242w are substantially perpendicular to the back surface 206b. In some embodiments, the deep isolation trenches 242 may also be slightly tapered, and hence the sidewalls 242w of the deep isolation trenches 242 are slightly tilted relative to the back surface 206b. For example, an angle α between the sidewall 242w and the back surface 206b may be greater than about 88 degrees and smaller than 90 degrees.

In some embodiments, the deep isolation trenches 242 may have a depth D1 in a range between about 0.5 μm and about 10 μm, and a width W1 in a range between about 0.025 μm and about 0.3 μm. In some embodiments, an aspect ratio D1/W1 of the deep isolation trench 242 may be in a range between about 10 and 20.

In some embodiments, the etching process is performed through a dry etching method including, and not limited to, Inductively Coupled Plasma (ICP), Transformer Coupled Plasma (TCP), Electron Cyclotron Resonance (ECR), Reactive Ion Etch (RIE), and the like. The etching process may be performed using process gases including, fluorine-containing gases, such as $SF_6$, $CF_4$, $CHF_3$, $NF_3$, Chlorine-containing gases (such as $Cl_2$), $Br_2$, HBr, $BCl_3$, and/or the like.

When viewed from the top, the deep isolation trenches 242 form a grid and divide the continuous doped region 206 to array of pixel regions for the pixel devices 222. The deep isolation trenches 242 align with the boundaries of the connection features 214 and expose the connection features 214 at bottoms 242b. In some embodiments, the deep isolation trenches 242 may have a width greater than a width of the corresponding features 214, and the bottoms 242b of the deep isolation trenches 242 may include a portion of the doped region 206 and a portion of the connection feature 214 as shown in FIG. 9. The sidewalls 242w are portions of the doped regions 206.

Figure 10:
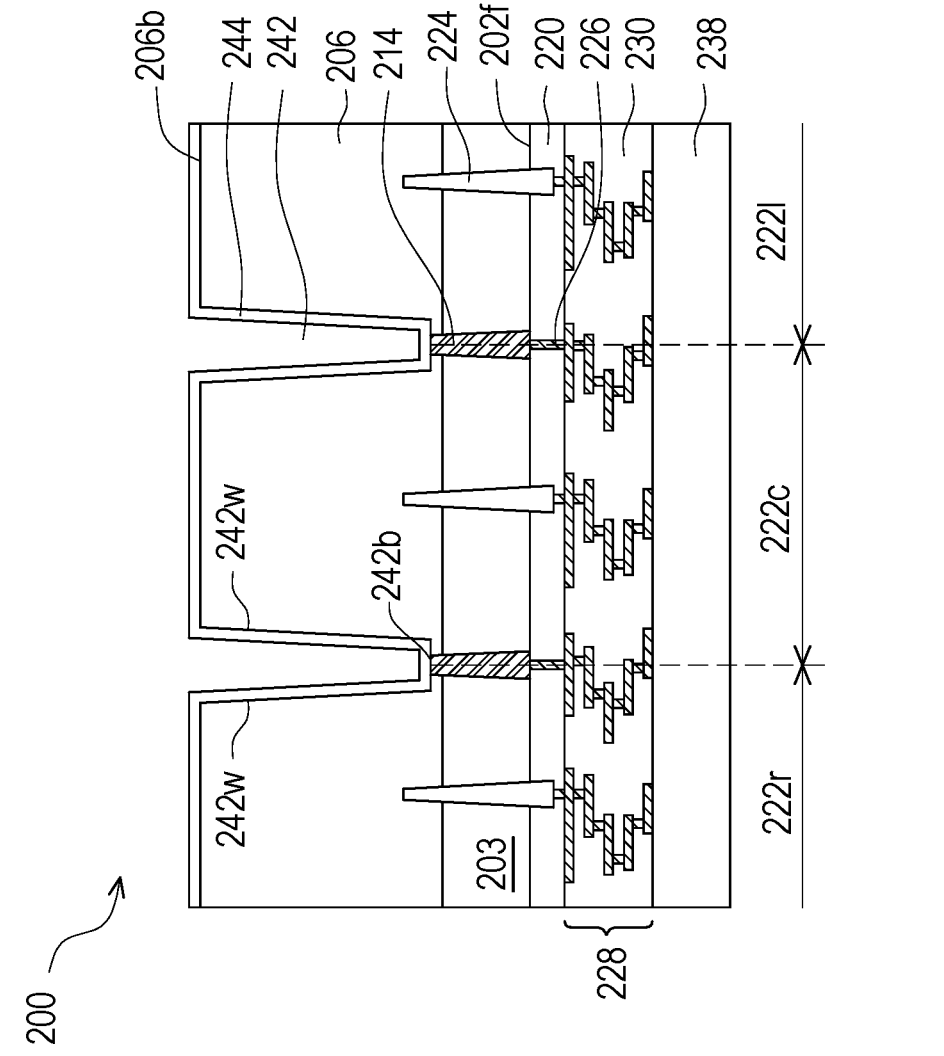

In operation 114, an isolation layer 244 is deposited, as shown in FIG. 10. In some embodiments, the isolation layer 244 may be formed by a blanket deposition on all exposed surfaces, including the sidewalls 242w and bottoms 242b of the deep isolation trenches 242. The isolation layer 244 is in contact with the doped region 206 on the sidewalls 242w and the bottom 242b. As discussed below, the isolation layer 244 includes interstitial holes to trap any electrons in from the adjacent doped regions from penetrating. In some embodiments, the isolation layer 244 may have a thickness in a range between about 1 angstrom to about 500 angstroms. If thinner than 1 angstrom, the isolation layer 244 may not be sufficient to prevent electron penetration. If thicker than 500 angstroms, the isolation layer 244 may reduce volume of active or functional regions of the semiconductor substrate 202 without additional benefit.

In some embodiments, the isolation layer 244 may include a doped semiconductor material. In some embodiments, the isolation layer 244 includes p+ type semiconductor material. For example, the isolation layer 244 may include a p– type semiconductor material, such as silicon (Si), silicon carbide (SiC), or silicon geranium (SiGe) with a dopant concentration with a p-type dopant, such as boron (B), aluminum (Al), and gallium (Ga). In some embodiments, the isolation 244 may have a dopant concentration greater than $1E14/cm^3$. For example, the isolation layer 244 may be a p+ doped semiconductor having a dopant concentration in a range between about $1E14/cm^3$ and about $1E17/cm^3$. A dopant concentration lower than $1E14/cm^3$ may not provide enough free radicals to provide passivation to the adjacent semiconductor materials, such as the doped region 206. A dopant concentration higher than $1E17/cm^3$ may increase manufacture cost without additional benefits for controllable passivation in the DTI structures to be connected.

Figure 11:
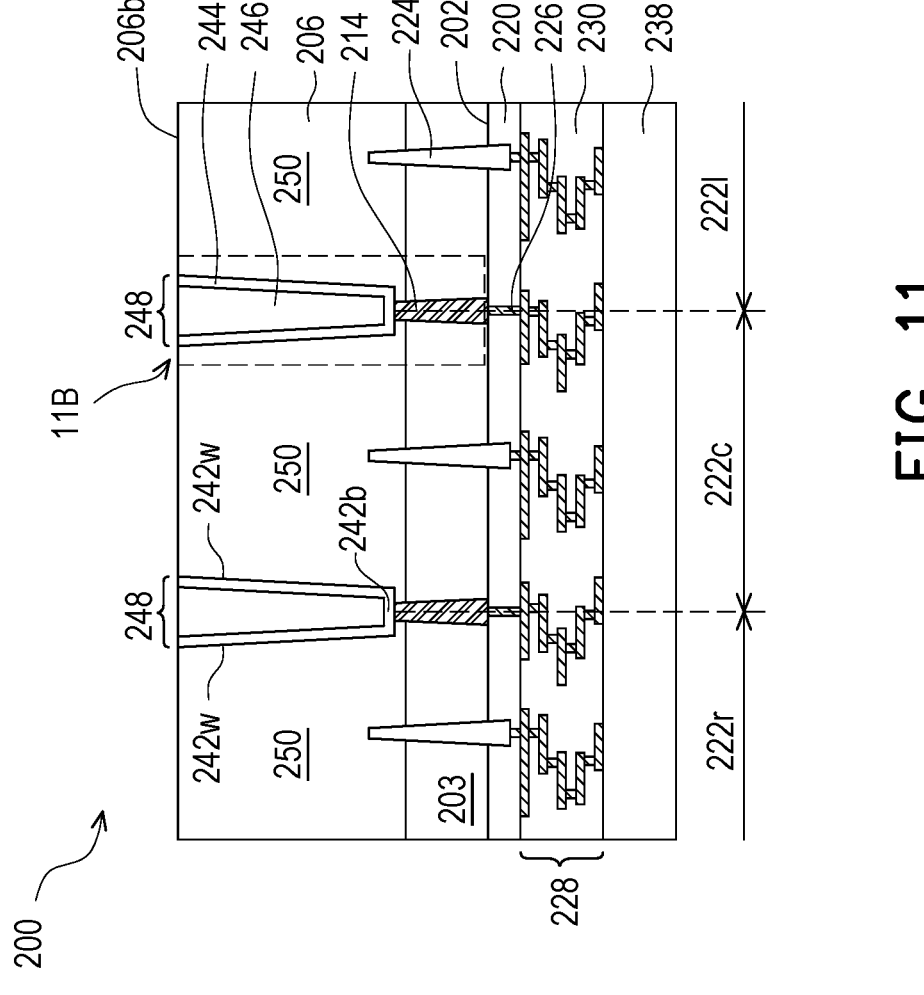

In operation 116, a filing material 246 is deposited on the isolation layer 244 and fill the deep isolation trenches 242, as shown in FIG. 11. In some embodiments, the filling material 246 may be a dielectric material. For example, the filling material 246 may be an oxide, such as silicon oxide. The filling material 246 may be deposited using any suitable process, such as chemical vapor deposition (CVD), atomic layer deposition (ALD). In some embodiments, the silicon oxide is formed by CVD using a suitable precursor, such as silane ($SiH_4$) or tetraethoxysilane or $Si(OC_2H5)_4$ (TEOS). In some embodiments, the filling material 246 may over fill the deep isolation trenches 242 after deposition. A subsequent planarization process, such as a CMP process, may be performed to expose the doped region 206 and the isolation layer 244.

Figure 11A:
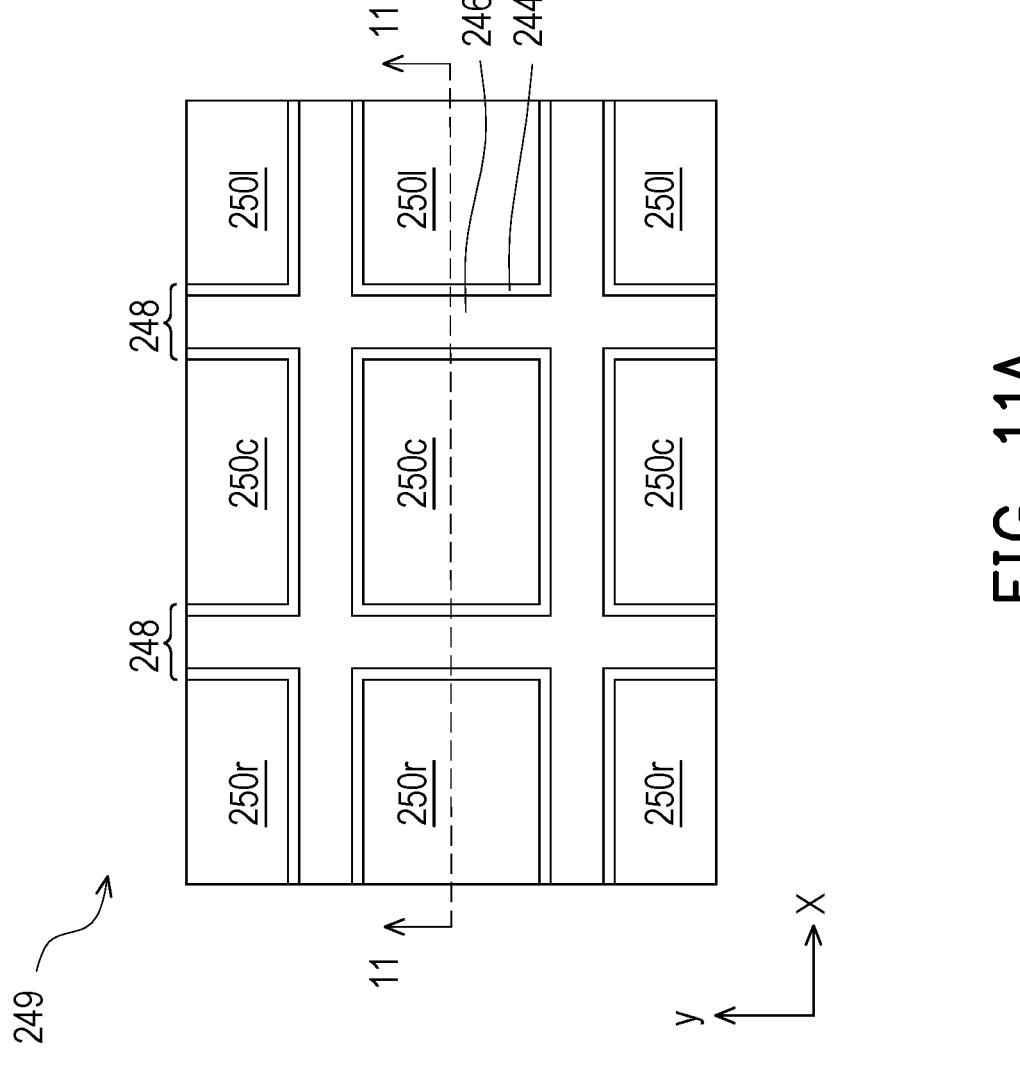

The filing material 246 and the isolation layer 244 in the deep isolation trenches 242 form a backside deep trench isolation (BDTI) structure 248. FIG. 11A is a schematic top view of the semiconductor device 200 after operation 116. FIG. 11A illustrates that the BDTI structure 248 forms a BDTI grid 249 in the continuous doped region 206 and divide the doped region 206 into the array of sensing regions 250r, 250c, 2501 (collectively 250). Each sensing region 250 corresponds to one pixel element 222 and functions as the light sensing area in the pixel element 222.

Figure 11B:
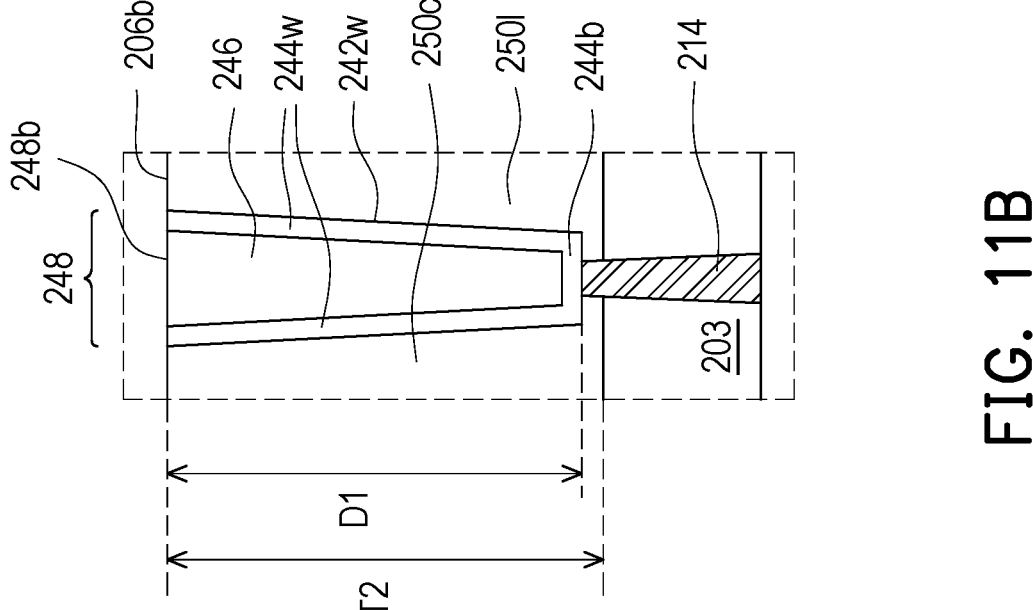

In the embodiment shown in FIG. 11, the BDTI structure 248 does not extend through the entire thickness of the continuously doped region 206. FIG. 11B is a partial enlarged view of the cross-sectional view of the semiconductor device 200 in the area marked by 11B in FIG. 11. As shown in FIG. 11B, the depth D1 of the BDTI structure 248 is less than the thickness T2 of the continuous doped region 206. The BDTI structure 248 connects to the connection features 214 within the continuously doped region 206. The sensing regions 250 are separated from each other by the combination of the BDTI structure 248 and the connection features 214.

Figure 12:
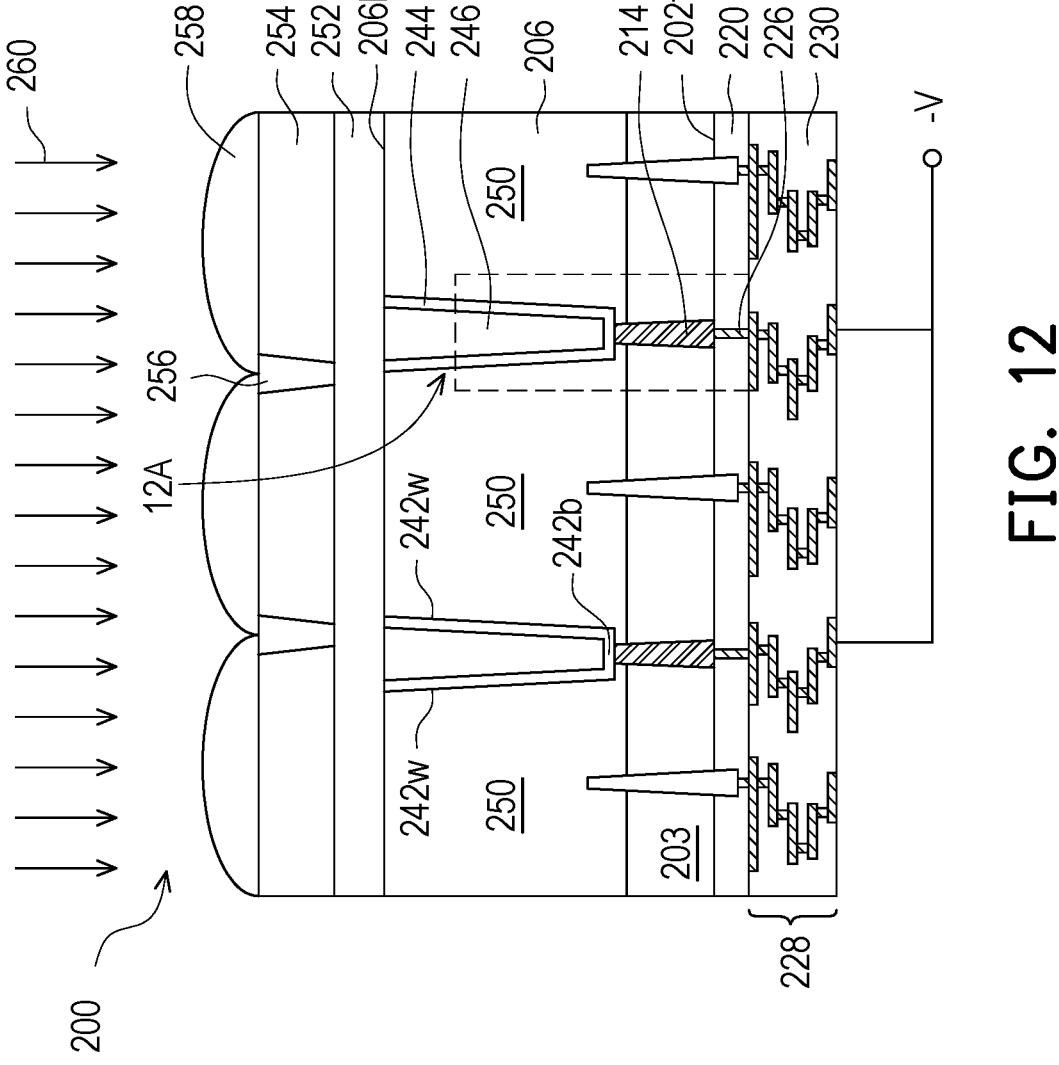

In operation 118, a plurality of color filters 254 are formed over the device elements 222, as shown in FIG. 12. In some embodiments, one or more absorption enhancement layers 252 may be deposited on the back surface 206b prior to forming the color filters 254. The one or more absorption enhancement layers 252 is configured to increase absorption of radiation by the sensing regions 250 by providing for a low reflection of radiation from the semiconductor substrate 202. In some embodiments, the one or more absorption enhancement layers 252 may comprise a high-k dielectric material and a layer of silicon oxide.

The plurality of color filters 254 are formed over the one or more absorption enhancement layers 252. In some embodiments, the plurality of color filters 254 are aligned with the device elements 222. The plurality of color filters 254 may be formed by depositing a color filter layer and patterning the color filter layer. The color filters 254 are formed of material that allows transmission of radiation having a specific range of wavelength while blocking light of wavelengths outside of the specified range.

In some embodiments, an isolation structure 256 may be formed between neighboring color filters 254 to prevent radiation transmitted from one color filters 254 from projecting into the pixel regions 250 under neighboring color filters 254.

In operation 120, a plurality of micro lenses 258 are formed over the plurality of color filters 254, as shown in FIG. 12. In some embodiments, the plurality of micro lenses 258 may be formed by depositing a micro-lens material above the plurality of color filters 254 by a suitable process, such as a spin-on method or a deposition process. In some embodiments, a micro lens template having a curved upper surface is patterned above the micro lens material. The micro lens template may comprise a photoresist material, for example, for a negative photoresist. For a negative photoresist, more light is exposed at a bottom of the curvature and less light is exposed at a top of the curvature. The micro-lens template is then developed and baked to form a rounding shape. The plurality of micro-lenses 258 are then formed by selectively etching the micro lens material according to the micro-lens template.

As shown in FIG. 12, the semiconductor device 200 is an imaging sensing device including a plurality of device elements 222 with light sensing regions 250 separated by the BDTI structure 248. Electromagnetic radiation 260, such as light, projects to the sensing regions 250 through the corresponding micro-lens 258 and color filter 254, and the sensing regions 250 emit electrons because of photoelectric effect. The BDTI structure 248 according to the present disclosure includes the isolation layer 244 in contact with the semiconductor substrate 202. Depending on the doping property of the semiconductor substrate 202, the isolation layer 244 forms a p+/n junction or a p+/p high-low junction or a p+/intrinsic high-low junction depending on the semiconductor material in direct contact with the isolation layer 244 of the BDTI structure 248. The intrinsic built-in fields within the p+/n junction or the p+/p high-low junction or p+/intrinsic high-low junction and p+/intrinsic high-low junction could provide physical passivation. Particularly, the intrinsic built-in field of the p+/n junction formed between the isolation layer 244 and a sensing region 250 prevents electrons in the sensing region 250 from crossing the BDTI structure 248 to the neighboring sensing region 250.

Figure 12C:
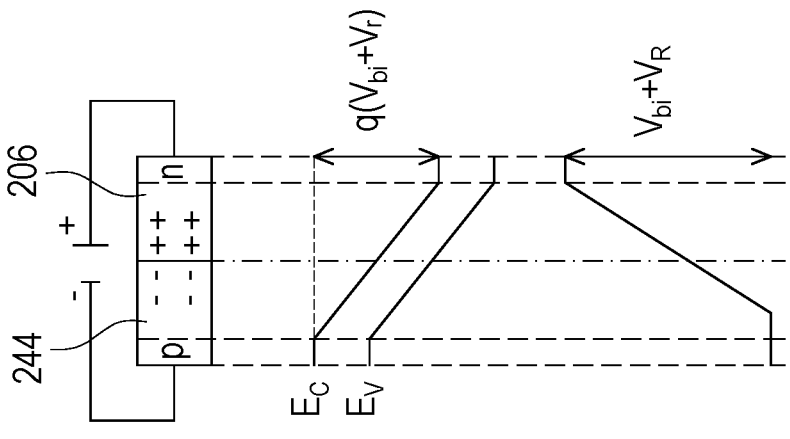
Figure 12B:
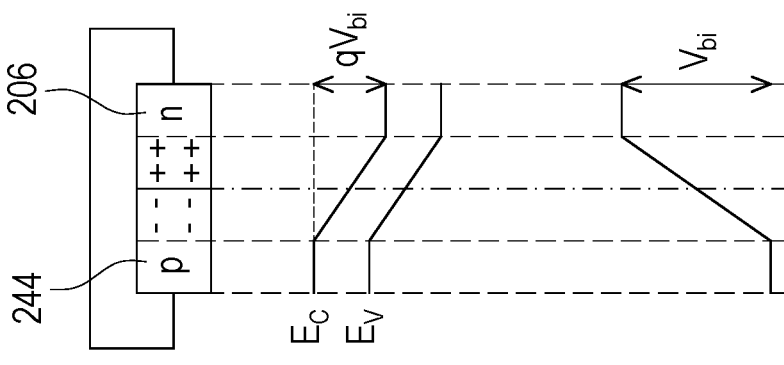
Figure 12A:
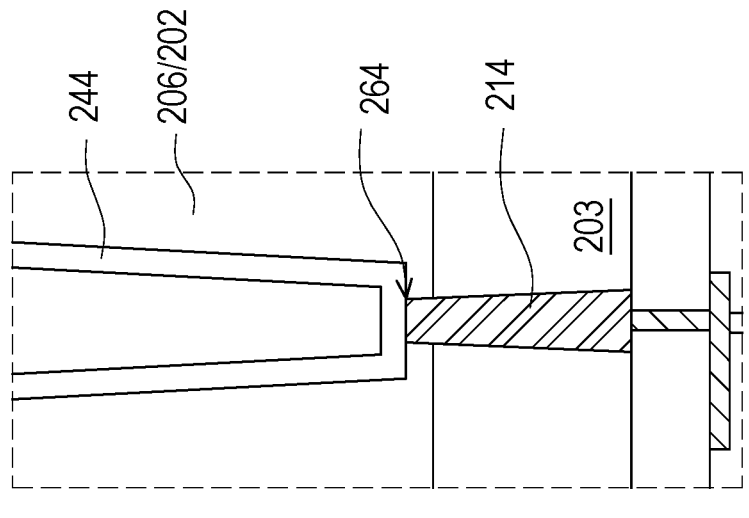

FIG. 12A is a schematic enlarged partial view of the semiconductor device 200 in an area marked 12A in FIG. 12. FIG. 12A shows the boundary between the BDTI structure 248 and the sensing region 250 is defined by the isolation layer 244 and the doped region 206 of the semiconductor substrate 202, which would form a p+/n junction because the isolation layer 244 includes a p-doped semiconductor material and the doped region 206 is a n-doped semiconductor. FIG. 12B is a schematic graph showing band-edge energies Ec, Ev in the p-region and n-region, which reflects the intrinsic built-in field. As shown in FIG. 12B, he p+/n junction between the isolation layer 244 and the doped region 206 of the semiconductor substrate 202 has a negative built-in field. A simulation has shown that when the p-region of a p-n junction includes p+ doped polysilicon of 1 nm thick, and the n-region of the p-n junction includes n doped silicon of 50 nm thick and a dopant concentration at $1E17/cm^3$, the intrinsic built-in field of the p-n junction is about −3.55 MeV/cm. The negative built-in voltage would provide passivation.

It should be noticed that because the connection features 214 are also formed from p-doped semiconductor material, the interface between the connection features 214 and the doped region 206, as pointed by arrow 264 in FIG. 12, also form a similar p+/n junction and provide passivation.

In some embodiments, a reverse bias may be applied to the p+/n junction between the isolation layer 244 and the doped region 206 of the semiconductor substrate 202 to enhance the value of negative field and the passivation. FIG. 12C is a schematic graph showing band-edge energies Ec, Ev in the p-region and n-region in the p+/n junction between the isolation layer 244 and the doped region 206 with a reverse bias applied. A simulation to a reverse voltage of −0. 01V to the same p-n junction, which has p+ doped polysilicon of 1 nm thick and n doped silicon of 50 nm thick and a dopant concentration at $1E17/cm^3$, the electric field of the p-n junction is −4. 25 MeV/cm, a 21. 43% increase in strength.

In some embodiments, a reverse bias or negative voltages may be applied to the isolation layer 244 of the BDTI structure 248 to enhance passivation. In some embodiments, the negative voltage may be applied to the isolation layer 244 via the connection features 214. As shown in FIG. 12, a negative voltage is applied to the isolation feature 244 via the connection feature 214 and the corresponding conductive paths in the interconnect structure 228. The value of the negative voltage may be adjusted or tuned according to the properties of the isolation layer 244 and the doped region 206. In some embodiments, the negative voltage may be in a range between about −0.01 V and about −0.2 V.

In the semiconductor device 200, materials on the sidewalls 242w that is in contact with the isolation layer 244 of the BDTI structure 248 is a n-type doped semiconductor. The BDTI structure 248, with p-type doped semiconductor on an outer layer, is compatible with passivation when on any types of semiconductor material in contact with the sidewalls, such as p-type, intrinsic, or n-type semiconductor materials because the p+ doped semiconductor in the isolation layer 244 has or may be biased to have a higher potential than p type, intrinsic and n type semiconductor in the sidewall. Without applying voltage, there exists the barrier height at the interfaces between the isolation layer 244 and materials in the sidewall 242w, providing physical passivation, that is the electrons were repelled away from interface traps without recombination. Embodiments of the present disclosure also enables a controllable passivation through applying a negative voltage. The applied negative voltage induces hole accumulation and raises barrier height as well as electronic field to enhances the passivation in a controllable manner.

Figure 12D:
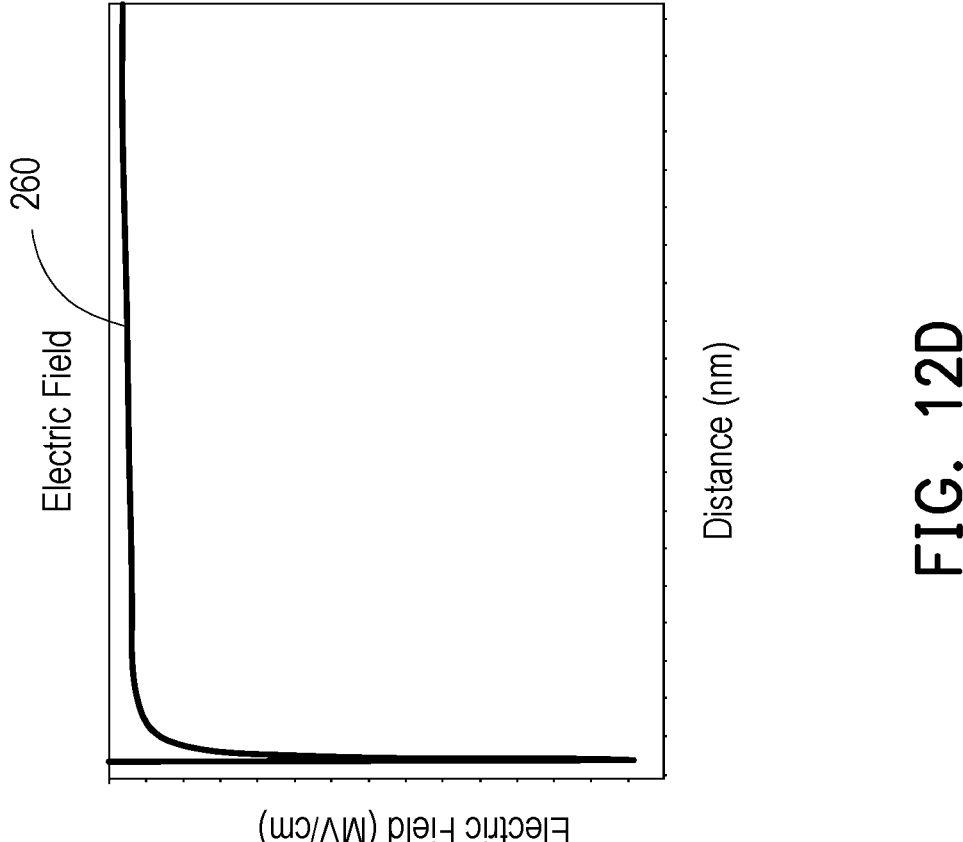
Figure 12E:
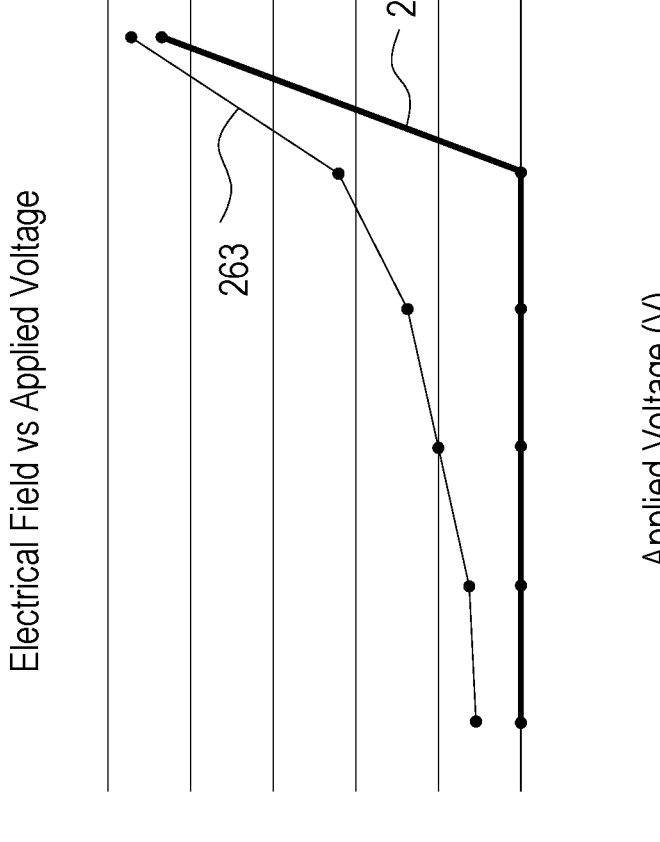

By tuning the value of the negative voltage or reverse bias to the isolation layer 244 of the BDTI structure 248, the BDTI structure 248 may provide enhanced passivation to materials in the sidewall 242w, including p-type semiconductor, n-type semiconductor, and intrinsic semiconductors. For example, if the doped region 206 is replaced with an un-doped semiconductor material, a reverse bias of a certain value may be applied to the isolation layer 244 to provide passivation. Similarly, if the doped region 206 includes a p type dopant, a reverse bias of a greater value may be applied to the isolation layer 244 to provide passivation. FIGS. 12D and 12E include simulation values of an interface between a p-doped polysilicon and an n-type silicon, in which the p-doped polysilicon has a thickness of 1 nm as an isolation layer. FIG. 12D includes exemplary simulation results showing voltage values in the n-type silicon. The x-axis in FIG. 12D represents the distance from the interface in the n-type silicon material. Curve 260 demonstrates the electric field at various location from the interface when no bias voltage is applied. As shown in FIG. 12D, the interface has a negative voltage when no bias voltage is applied. FIG. 12E shows electric field values and gains with respect to the values of applied bias. In FIG. 12E, the x-axis represents the value applied negative bias. Curve 262 in FIG. 12E indicates value of the electric field at the interface in response to the negative bias applied. Curve 264 reflects the gain of the electric field at the interface in response to the negative bias applied. By applying a negative voltage, the electric field at the interface is enhanced.

Figure 13:
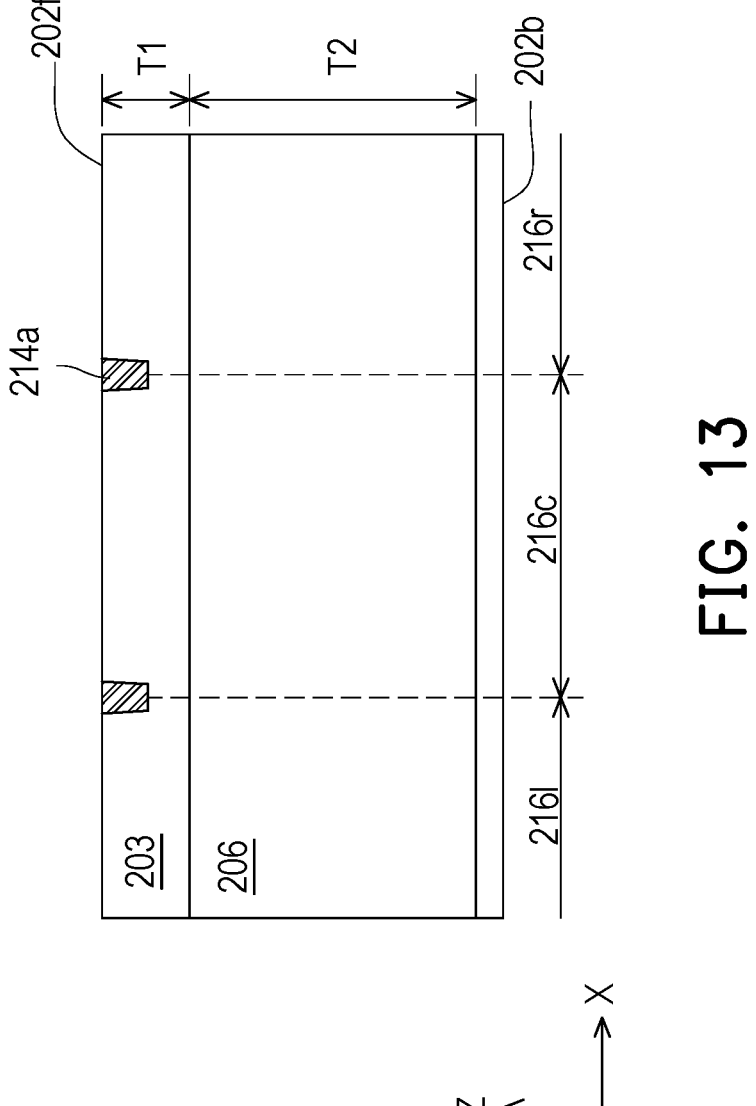
FIGS. 13, 14, and 14A schematically illustrate a semiconductor device according to another embodiment of the present disclosure.
Figure 14:
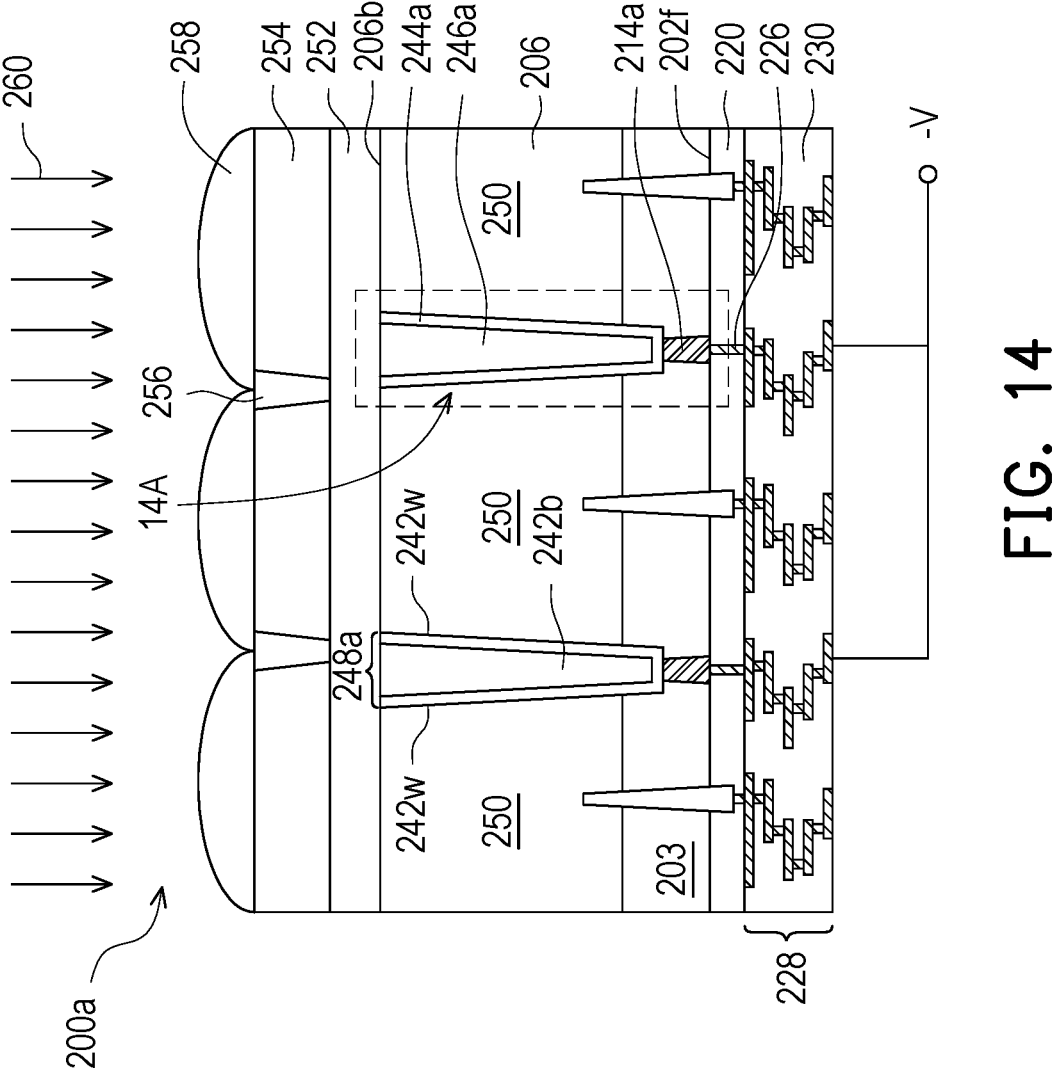
Figure 14A:
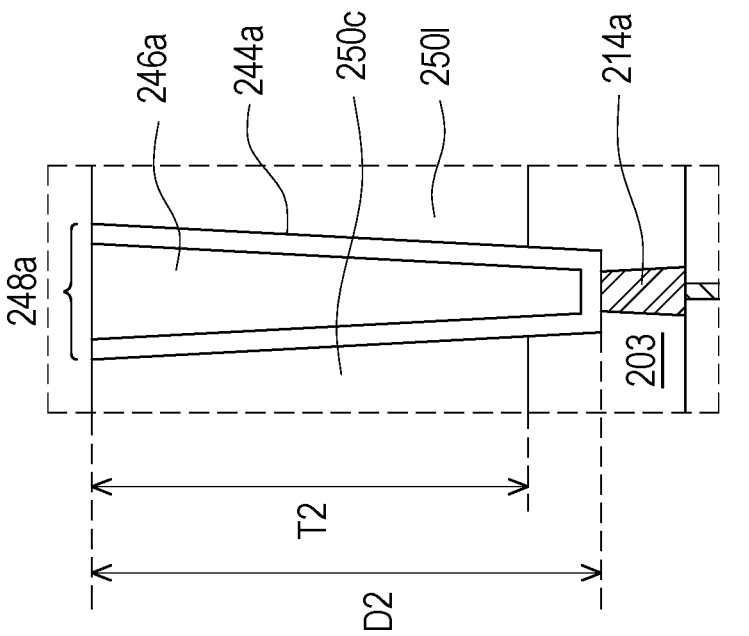

In the semiconductor device 200, the BDTI structure 248 does not penetrate through the entire thickness T2 of the doped region 206. Alternatively, BDTI structure according to the present disclosure may be formed through the doped region 206. FIGS. 13, 14, 14A schematically demonstrate a semiconductor device 200a according to another embodiment of the disclosure. Like the semiconductor device 200, the semiconductor device 200a may also be formed using the method 100. At operation 104, connection trenches are etched to a lesser depth without reaching the doped region 206 and connection features 214a are formed within the transistor region 203 and above the doped region 206, as shown in FIG. 13. In operation 112, deep isolation trenches 242a penetrate the entire thickness T2 of the doped region 206 to reach the connection features 214a. An isolation layer 244a is subsequently deposited to surround the entire depth of the sensing regions 250 for each pixel element 222. A filling material 246a is then deposited and forming a BDTI structure 248a, as shown in FIG. 14.

FIG. 14A is a partial enlarged view of the cross sectional view of the semiconductor device 200a in the area marked by 14A in FIG. 14. As shown in FIG. 14A, the depth D2 of the BDTI structure 248a is greater than the thickness T2 of the doped region 206. The BDTI structure 248a connects to the connection features 214 outside the doped region 206. The isolation layer 244a is in contact with the doped region 206 and transistor region 203 of the semiconductor substrate 202.

The BDTI structure 248a of the semiconductor device 200a and the BDTI structure 248 of the semiconductor device 200 function similarly, thus, providing process flexibility. For example, the BDTI structure 248 within the semiconductor device 200 may have various depths without affecting uniformity of performance.

Figure 16:
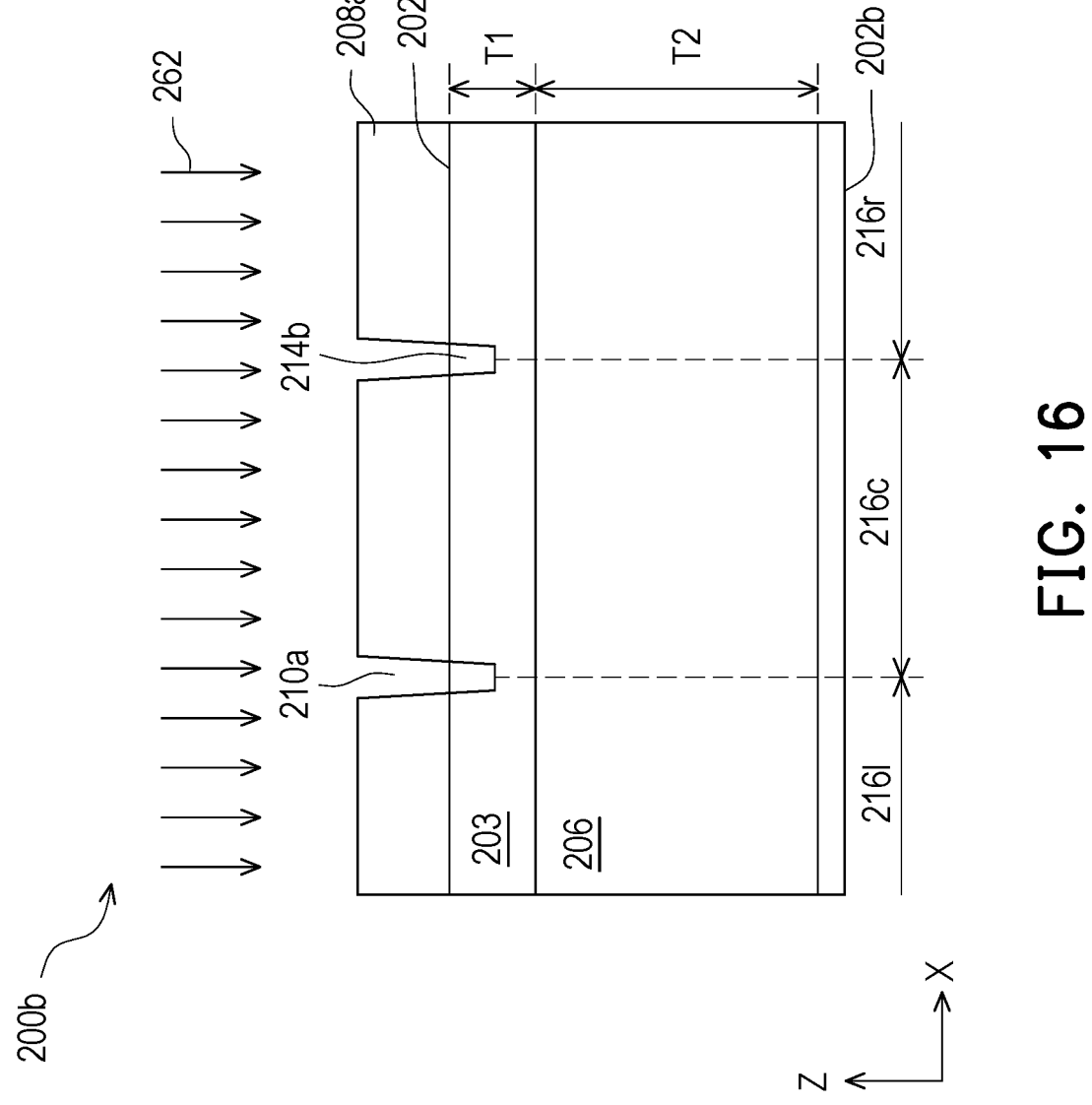
FIGS. 16 and 17 schematically illustrate a semiconductor device at various stages of fabrication according to the method of FIG. 15.
Figure 17:
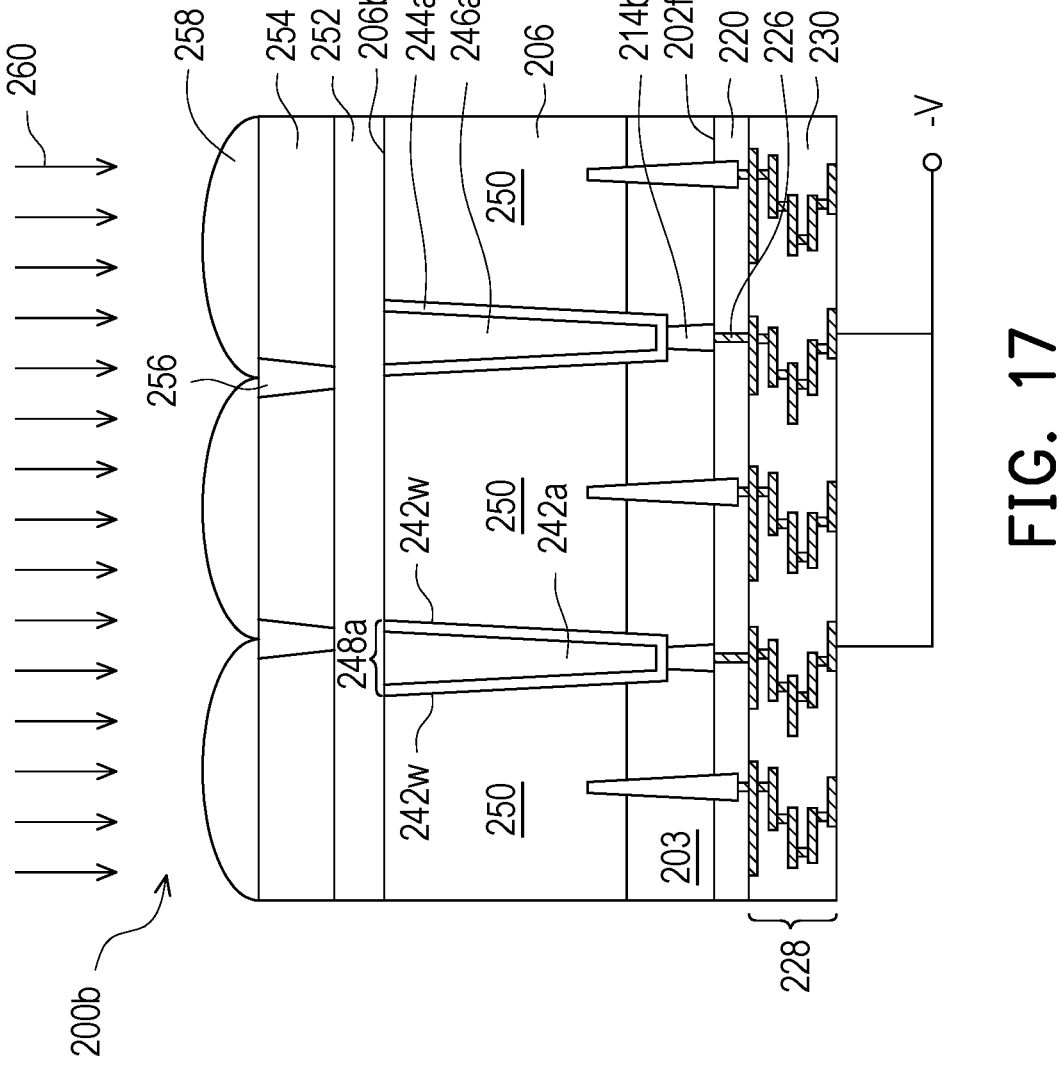

FIG. 15 is a flow chart of a method 100a for fabricating a semiconductor device including DTIs according to embodiments of the present disclosure. The method 100a is similar to the method 100 except that instead of etching the connection trenches 212 and filling the connection trenches 212 to form the connection features 214, connection features are formed by a selective doping process in operations 104a and 104b. FIGS. 16 and 17 schematically illustrate a semiconductor device 200b after operations 106a and operation 122 of the method 100.

At operation 104a, a masking layer 208a may be deposited on the front surface 202f of the semiconductor substrate 202, as shown FIG. 16. A patterning process, such as a photolithography process, is performed form a plurality of openings 210a through the masking layer 208a and expose the front surface 202f of the transistor region 203 of the semiconductor substrate 202. In some embodiments, the masking layer 208a may comprise photoresist or a nitride, such as SiN, patterned using a photolithography process. The masking layer 208 may have At operation 106a, connection features 214a are formed to in the transistor region 203 of the semiconductor substrate 202, as shown in FIG. 16. The connection features 214 are formed by an implantation process to implant dopants 262 to the transistor region 203 through the plurality of openings 210a. The dopants 262 may include one or more p-type dopants, such as boron (B), aluminum (Al), and gallium (Ga). In some embodiments, the connection features 214a may have a dopant concentration in a range between about $1E14/cm^3$ and about $1E17/cm^3$. The connection features 214a remain within the transistor region 203. The connection features 214a form a connection grid in the transistor region 203. The connection grid of the connection features 214a may be arranged in a suitable manner, for example as shown in FIGS. 5A-5C.

Operations 108 and 120 are subsequently performed to form the semiconductor device 200b as shown in FIG. 17. The semiconductor devices 200b includes BDTI structure 248a which penetrate through the doped region 206 and in contact with the connection features 214a in the transistor region 203 of the semiconductor substrate 202.

Even though examples described above relate to image sensors with BSI image sensors, embodiments of the present disclosure can be used with frontside illumination (FSI) image sensors. Even though in examples described above, a reverse bias may be applied to the deep trench isolation structures through a frontside interconnect structure, other structures, such as a backside interconnect structure, a backside power rail, may be used to apply reverse bias. Even though examples described above relate to semiconductor devices with image sensors, the DTI structure according to the present disclosure may be used in any type of devices where deep trench isolation structure are used.

Various embodiments or examples described herein offer multiple advantages over the state-of-art technology. The DTI structure with an isolation layer including p-type doped semiconductor material enables and enhances a controllable physical passivation on sidewalls of the DTI structure. The DTI structure are compatible with passivation when on any types of semiconductor material in contact with the sidewalls, such as p-type, intrinsic, or n-type semiconductor materials. The DTI structure according to the present disclosure has a structural design with simplicity. The structure can be fabricated by small modifications to the existing process follow. Additionally, because the DTI structure of the present disclosure is not formed in a deep doped p-well as practiced in current technology, one or more patterning and doping steps are omitted, thus, reducing cost of ownership. By omitting the deep doped p-well, the DTI structure of the present disclosure enables further reduction of the device dimensions. For example, the BDTI structure according to the present disclosure enables CMOS image sensors with pixel size of less than 0. 6 um.

Some embodiments of the present disclosure provide a method. The method includes forming a continuous doped region in a semiconductor substrate by a blanket implantation process, where the continuous doped region is at a first distance under a front surface of the semiconductor substrate; forming one or more connection features in a transistor region between the front surface and the continuous doped region, where the one or more connection features include a first p-type semiconductor material; forming a plurality of pixel elements in and on the semiconductor substrate; forming an interconnect structure, where the interconnect structure is in electric connection with the one or more connection features; forming deep isolation trenches from a backside of the semiconductor substrate, where the deep isolation trenches divide the continuous doped region into a plurality of sensing regions corresponding to the plurality of pixel units, and the one or more connection features are exposed by the deep isolation trenches; growing an isolation layer on sidewalls of the deep isolation trenches and on the connection features, where the isolation layer includes a second p-type semiconductor material; filling the deep isolation trenches with a filling material; forming a plurality of color filters; and forming a plurality of micro lenses.

Some embodiments of the present disclosure provide a method. The method also includes forming a connection grid pattern on a front surface of a semiconductor substrate; forming a connection grid in the semiconductor substrate from the front surface of the semiconductor substrate; forming a plurality of devices on the semiconductor substrate; forming an interconnect structure, where the connection grid is electrically connected to the interconnect structure; forming a deep isolation grid pattern over a back side of the semiconductor substrate; etching the semiconductor substrate to form deep isolation trenches partially through the semiconductor substrate to expose the connection grid; growing an isolation layer on sidewalls of the deep isolation trenches and on the connection grid, where the isolation layer may include a p-type semiconductor material; and filling the deep isolation trenches with a dielectric material.

Some embodiments of the present disclosure provide a structure. The structure also includes a connection feature disposed in a semiconductor substrate, where a top surface of the connection feature is co-planar with a front surface of the semiconductor substrate; a deep trench isolation (DTI) structure formed in the semiconductor substrate, where a first surface of the deep trench isolation is coplanar with a back surface of the semiconductor substrate, a bottom of the DTI structure is in contact with the connection feature, and the DTI structure may include: an isolation layer, where the isolation layer includes a sidewall portion in contact with the semiconductor substrate and a bottom portion in contact with the connection feature, where the isolation layer may include a p-type semiconductor material; and a filling material disposed on the bottom portion and sidewall portion of the isolation layer; a plurality of device elements formed in and on the semiconductor substrate, where the DTI structure separates individual device elements; and an interconnection structure in electrical connection with the plurality of device elements and the connection feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method comprising:
forming a continuous doped region in a semiconductor substrate by a blanket implantation process, wherein the continuous doped region is at a first distance under a front surface of the semiconductor substrate;
forming one or more connection features in a transistor region between the front surface and the continuous doped region, wherein the one or more connection features include a first p-type semiconductor material;
forming a plurality of pixel elements in and on the semiconductor substrate;
forming an interconnect structure, wherein the interconnect structure is in electric connection with the one or more connection features;
forming deep isolation trenches from a backside of the semiconductor substrate, wherein the deep isolation trenches divide the continuous doped region into a plurality of sensing regions corresponding to the plurality of pixel units, and the one or more connection features are exposed by the deep isolation trenches;
growing an isolation layer on sidewalls of the deep isolation trenches and on the connection features, wherein the isolation layer includes a second p-type semiconductor material;
filling the deep isolation trenches with a filling material;
forming a plurality of color filters; and
forming a plurality of micro lenses.

2. The method of claim 1, wherein forming the one or more connection features comprises:
forming one or more connection trenches from the front surface of the semiconductor substrate; and
depositing the first p-type semiconductor material in the one or more connection trenches.

3. The method of claim 2, wherein the one or more connection trenches extend from the front surface of the semiconductor substrate into the continuous doped region.

4. The method of claim 2, wherein a depth of the one or more connection trenches is less than the first distance.

5. The method of claim 2, wherein the first p-type semiconductor material comprises silicon, silicon carbide, or silicon germanium with one or more p-type dopants.

6. The method of claim 1, wherein forming the one or more connection features comprises:
forming a masking pattern on the front surface of the semiconductor substrate; and
selectively doping the transistor region of the semiconductor substrate using the masking pattern.

7. The method of claim 1, wherein the first p-type semiconductor material has a dopant concentration greater than $1E14/cm^3$.

8. The method of claim 1, wherein the second p-type semiconductor material comprises silicon, silicon carbide, or silicon germanium with one or more p-type dopants.

9. The method of claim 8, wherein the isolation layer has a thickness in a range between 1 angstrom and 500 angstroms.

10. The method of claim 1, wherein the p-type semiconductor material has a dopant concentration greater than $1E14/cm^3$.

11. A method, comprising:
forming a connection grid pattern on a front surface of a semiconductor substrate;
forming a connection grid in the semiconductor substrate from the front surface of the semiconductor substrate;
forming a plurality of device elements on the semiconductor substrate;
forming an interconnect structure, wherein the connection grid is electrically connected to the interconnect structure;
forming a deep isolation grid pattern over a back side of the semiconductor substrate;
etching the semiconductor substrate to form deep isolation trenches partially through the semiconductor substrate to expose the connection grid;
growing an isolation layer on sidewalls of the deep isolation trenches and on the connection grid, wherein the isolation layer comprises a p-type semiconductor material; and
filling the deep isolation trenches with a dielectric material.

12. The method of claim 11, wherein the sidewalls of the deep isolation trenches comprise a n-type semiconductor material.

13. The method of claim 12, wherein the isolation layer comprises silicon, silicon carbide, or silicon germanium with a dopant concentration rate is greater than $1E14/cm^3$.

14. The method of claim 11, wherein the connection grid comprises a p-type semiconductor material with a dopant concentration rate is greater than $1E14/cm^3$.

15. The method of claim 14, wherein forming the connection grid comprises:
etching the semiconductor substrate to form trenches in the front surface of the semiconductor substrate; and
filling the trenches with the p-type semiconductor material.

16. A method, comprising:
forming an image sensor comprising:
a connection feature disposed in a semiconductor substrate, wherein a top surface of the connection feature is co-planar with a front surface of the semiconductor substrate;
a deep trench isolation (DTI) structure formed in the semiconductor substrate, wherein a first surface of the DTI structure is coplanar with a back surface of the semiconductor substrate, and the DTI structure comprises:

an isolation layer, wherein the isolation layer includes a sidewall portion in contact with the semiconductor substrate and a bottom portion in contact with the connection feature, wherein the isolation layer comprises a p-type semiconductor material; and a filling material disposed on the bottom portion and sidewall portion of the isolation layer;

a plurality of device elements formed in and on the semiconductor substrate, wherein the DTI structure separates individual device elements; and an interconnection structure in electrical connection with the plurality of device elements and the connection feature.

17. The method of claim 16, wherein the isolation layer comprises silicon, silicon carbide, or silicon germanium with a dopant concentration rate greater than $1E14/cm^3$.

18. The method of claim 17, wherein the connection feature comprises silicon, silicon carbide, or silicon germanium with a dopant concentration rate greater than $1E14/cm^3$.

19. The method of claim 17, wherein a portion of the semiconductor substrate in contact with the sidewall of the DTI structure comprises a n-type dopant.

20. The method of claim 19, wherein the plurality of device elements are ap plurality of pixel elements for an imaging sensing device, and the DTI structure is in contact with sensing regions of the plurality of pixel elements.

\* \* \* \* \*